(12) United States Patent
Dembo et al.

(10) Patent No.: US 8,305,191 B2
(45) Date of Patent: Nov. 6, 2012

(54) SEMICONDUCTOR DEVICE AND POSITION DETECTION SYSTEM USING SEMICONDUCTOR DEVICE

(75) Inventors: Hiroki Dembo, Kanagawa (JP);
Yoshiyuki Kurokawa, Kanagawa (JP);
Takayuki Inoue, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1079 days.

(21) Appl. No.: 11/802,246

(22) Filed: May 21, 2007

(65) Prior Publication Data
US 2007/0273522 A1 Nov. 29, 2007

(30) Foreign Application Priority Data
May 22, 2006 (JP) .................................. 2006-141841

(51) Int. Cl.
*H04Q 5/22* (2006.01)
(52) U.S. Cl. ....................................................... 340/10.1
(58) Field of Classification Search ................. 340/572.1
See application file for complete search history.

(56) References Cited

U.S. PATENT DOCUMENTS

| | | | | |
|---|---|---|---|---|
| 3,680,097 A * | 7/1972 | Huntsinger | ..................... | 342/47 |
| 5,113,184 A | 5/1992 | Katayama | | |
| 5,801,627 A * | 9/1998 | Hartung | ..................... | 340/568.1 |
| 6,038,270 A * | 3/2000 | Watanabe et al. | ............. | 375/343 |
| 2001/0004236 A1 * | 6/2001 | Letkomiller et al. | ...... | 340/572.1 |
| 2002/0035654 A1 * | 3/2002 | Mori et al. | ..................... | 710/36 |
| 2002/0149482 A1 * | 10/2002 | Shanks et al. | .............. | 340/572.1 |
| 2003/0121985 A1 | 7/2003 | Baldischweiler et al. | | |
| 2004/0145454 A1 | 7/2004 | Powell et al. | | |
| 2004/0235428 A1 * | 11/2004 | Nagai et al. | ..................... | 455/85 |
| 2004/0264399 A1 * | 12/2004 | Verbist | ......................... | 370/319 |
| 2005/0190098 A1 | 9/2005 | Bridgelall et al. | | |
| 2006/0044147 A1 | 3/2006 | Knox et al. | | |
| 2006/0290484 A1 | 12/2006 | Bauchot et al. | | |
| 2007/0018829 A1 * | 1/2007 | Singh et al. | ................ | 340/572.4 |
| 2007/0073513 A1 | 3/2007 | Posamentier | | |
| 2007/0075873 A1 | 4/2007 | Yang et al. | | |

(Continued)

FOREIGN PATENT DOCUMENTS

EP 0309201 A 3/1989

(Continued)

OTHER PUBLICATIONS

International Search Report (Application No. PCT/JP2007/060313) Dated Jun. 19, 2007.

(Continued)

*Primary Examiner* — Brian Zimmerman
*Assistant Examiner* — Omer S Khan
(74) *Attorney, Agent, or Firm* — Eric J. Robinson; Robinson Intellectual Property Law Office, P.C.

(57) ABSTRACT

A position detection system is formed by network connection of a plurality of interrogators and a server. An RFID and the interrogators communicate wirelessly, whereby a distance from each interrogator to the RFID is searched to search a position of the RFID from the distance. In order to calculate the distance from the interrogator to the RFID, a signal is oscillated with a frequency corresponding to amplitude of a signal received in the RFID from the interrogator. A frequency of a signal oscillated in the RFID is detected in the RFID or by the interrogator, whereby a distance from the interrogator to the RFID is detected.

12 Claims, 27 Drawing Sheets

U.S. PATENT DOCUMENTS

2007/0096783 A1 * 5/2007 de la Torre .................... 327/156
2008/0001754 A1 * 1/2008 Ovard et al. ............... 340/572.1

FOREIGN PATENT DOCUMENTS

| | | |
|---|---|---|
| JP | 01-102693 A | 4/1989 |
| JP | 06-325229 A | 11/1994 |
| JP | 2002-259921 | 9/2002 |
| JP | 2004-271458 A | 9/2004 |
| JP | 2005-092343 | 4/2005 |
| JP | 2005-316724 | 11/2005 |
| JP | 2006-503376 | 1/2006 |
| JP | 2007-043316 | 2/2007 |
| WO | WO 2004/036482 A2 | 4/2004 |
| WO | WO 2004/036482 A3 | 4/2004 |

OTHER PUBLICATIONS

Written Opinion (Application No. PCT/JP2007/060313) Dated Jun. 19, 2007.

* cited by examiner

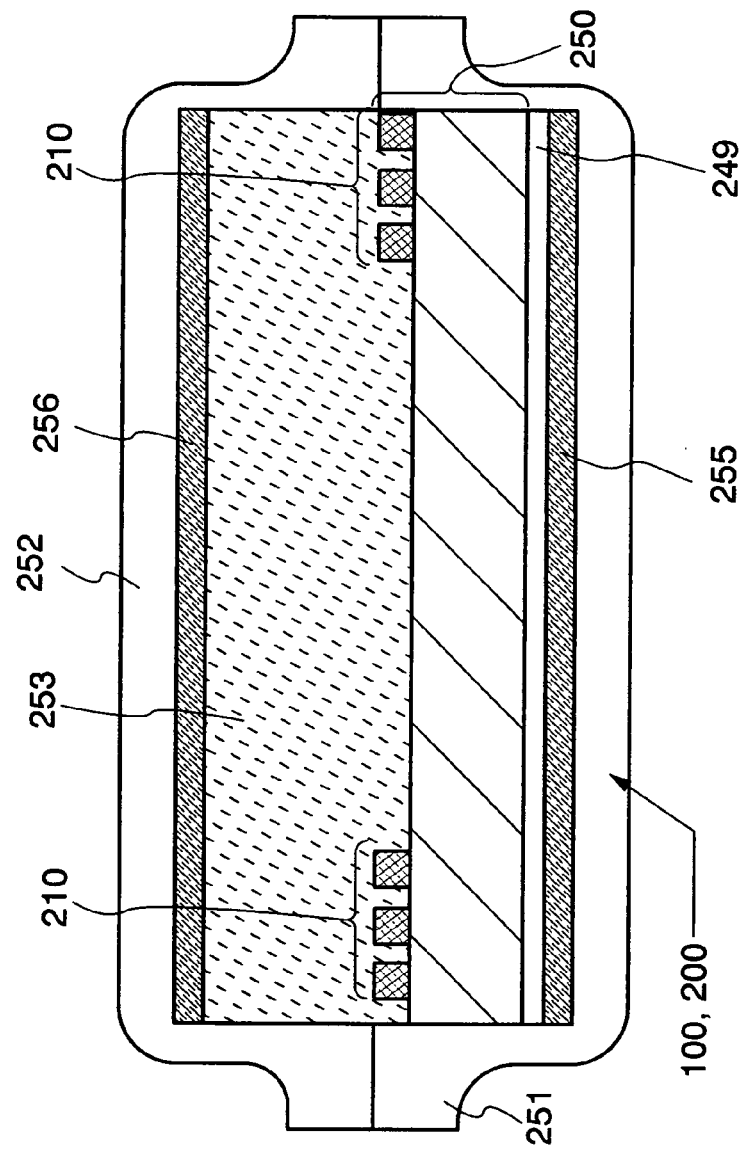
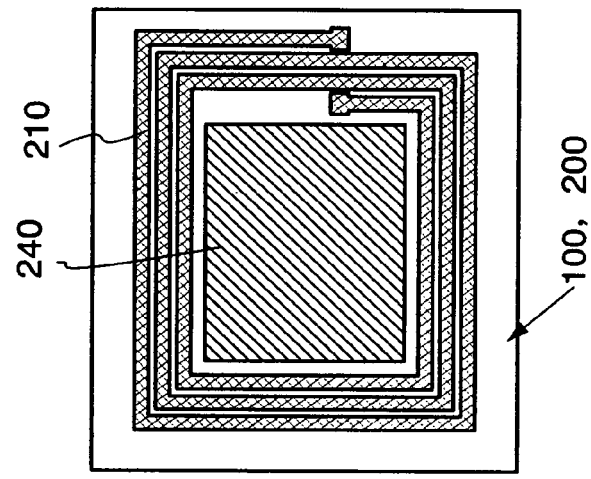
FIG. 18B
FIG. 18A

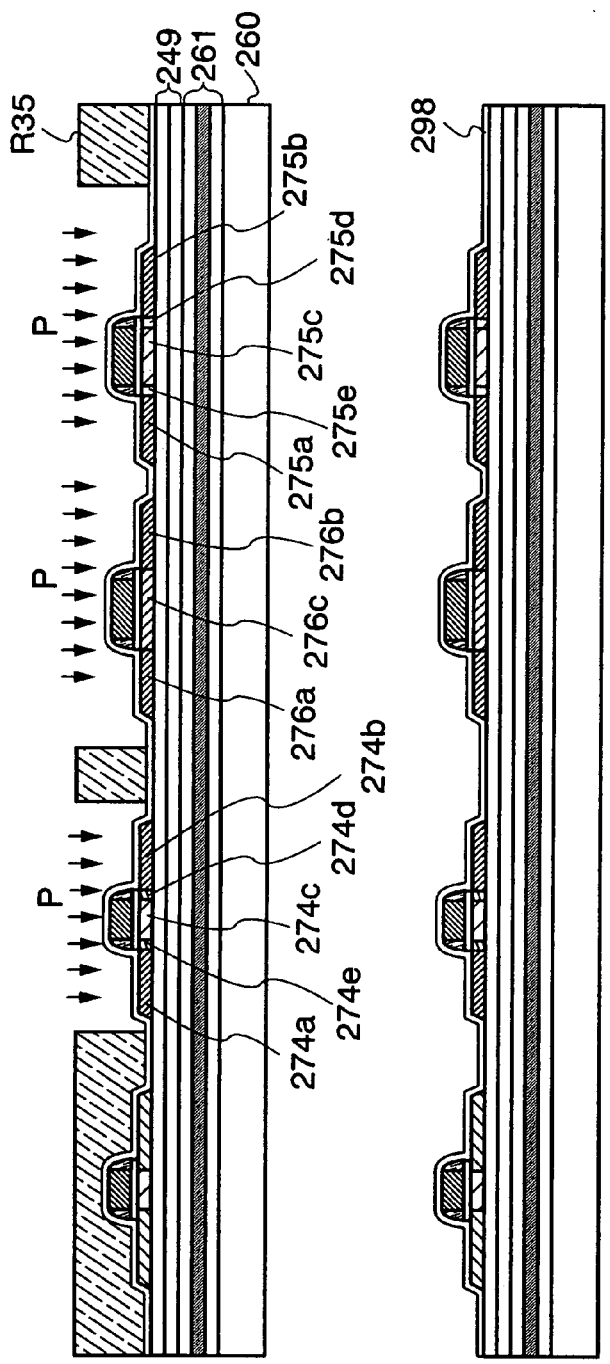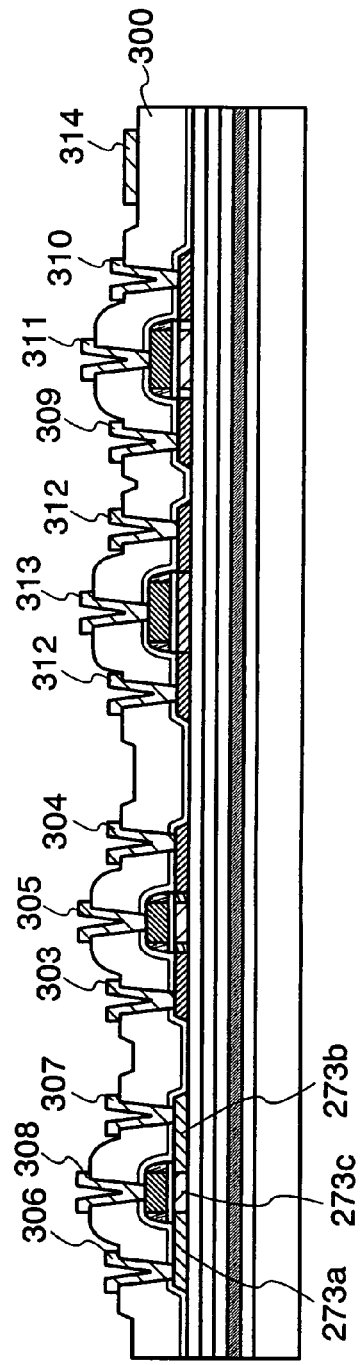

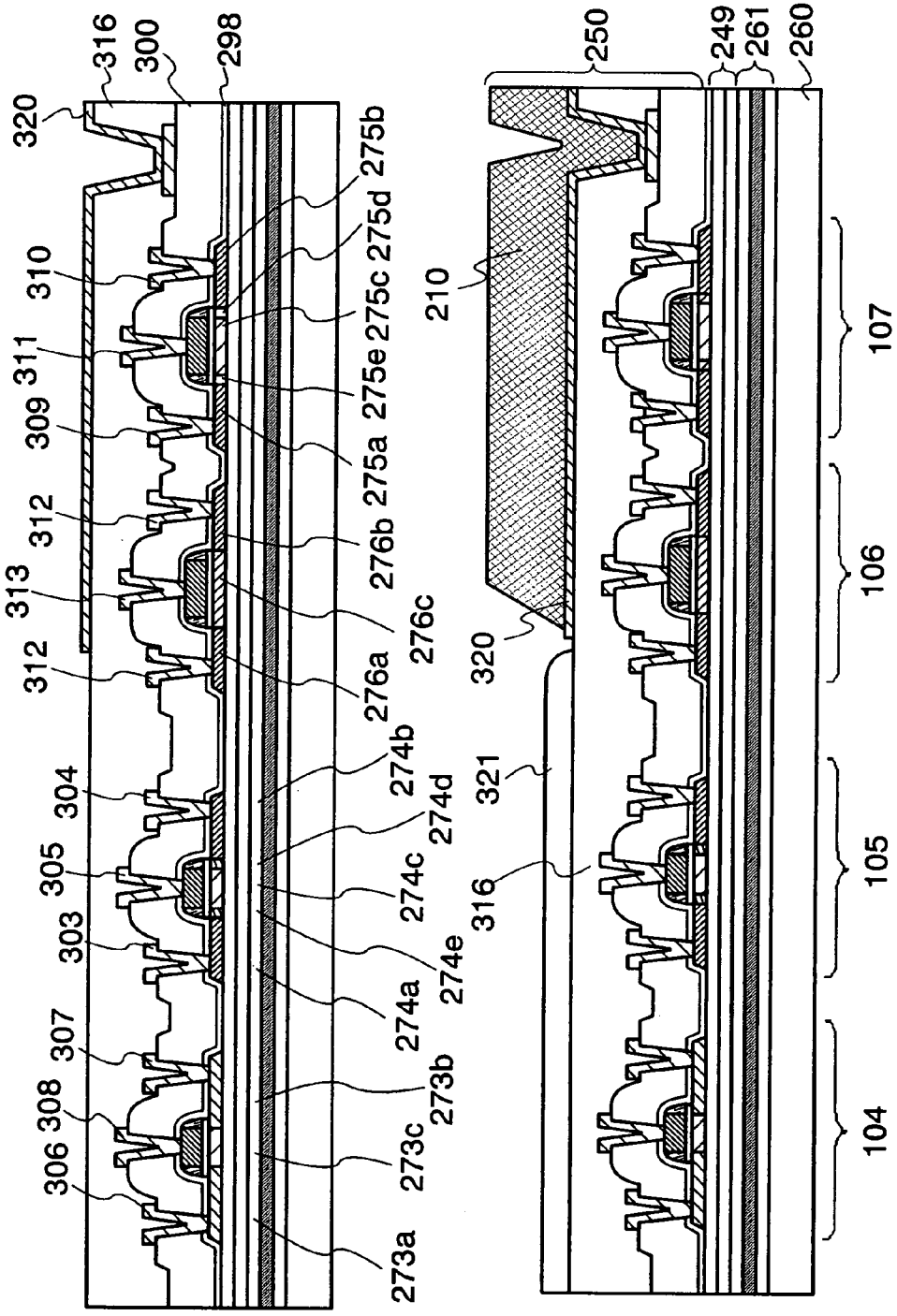

SEMICONDUCTOR DEVICE AND POSITION DETECTION SYSTEM USING SEMICONDUCTOR DEVICE

TECHNICAL FIELD

The present invention relates to a semiconductor device and a position detection system using the semiconductor device. The present invention particularly relates to a position detection system using a semiconductor device that performs position detection by a wireless signal from a plurality of interrogators.

BACKGROUND ART

In recent years, an individual identification technology using wireless communication through an electromagnetic field, an electric wave, or the like has attracted attention. In particular, as a semiconductor device that communicates data by wireless communication, an individual identification technology using an RFID (Radio Frequency Identification) tag has attracted attention. An RFID tag (hereinafter, simply referred to as an RFID) is also referred to as an IC (Integrated Circuit) tag, an IC chip, an RF tag, a wireless tag, or an electronic tag. The individual identification technology using an RFID has started to help production, management, or the like of an individual object and has been expected to be applied to personal authentication.

RFIDs can be divided into two types: an active-type RFID and a passive-type RFID, depending on whether it incorporates a power supply or it is supplied with electric power externally. An active-type RFID is disclosed in Reference 1, and a passive-type RFID is disclosed in Reference 2. An active-type RFID incorporates a power supply for driving the RFID and includes a cell as the power supply. In a passive-type RFID, an electric power for driving the RFID is made using an electric wave or electromagnetic wave (carrier wave) externally, and a structure in which a cell is not provided is realized.

FIG. 26 is a block diagram showing a specific structure of an active-type RFID. In an active-type RFID 1400 of FIG. 26, a communication signal received by an antenna circuit 1401 is input to a demodulation circuit 1405 and an amplifier 1406 in a signal processing circuit 1402. The communication signal is normally transmitted after processing such as ASK modulation or PSK modulation is performed on carriers of 13.56 MHz, 915 MHz, or the like. Here in FIG. 26, an example of a case of 13.56 MHz as a communication signal is shown.

In FIG. 26, a clock signal as a reference is needed in order to process signals. Here, the carrier of 13.56 MHz is used as a clock. The carrier of 13.56 MHz is amplified by the amplifier 1406 and then supplied to a logic circuit 1407 as a clock. Further, the communication signal that is ASK modulated or PSK modulated is demodulated in the demodulation circuit 1405. The demodulated signal is also transmitted to the logic circuit 1407 and analyzed. The signal analyzed in the logic circuit 1407 is transmitted to a memory control circuit 1408, and based on the signal, the memory control circuit 1408 controls a memory circuit 1409 and retrieves data stored in the memory circuit 1409 to transmit the data to a logic circuit 1410. The data transmitted from the memory circuit 1409 is encoded by the logic circuit 1410, and subsequently amplified by an amplifier 1411. A modulation circuit 1412 modulates the carrier in accordance with the signal.

An electric power in FIG. 26 is supplied by a cell 1403 provided outside the signal processing circuit 1402 through a power supply circuit 1404. The power supply circuit 1404 supplies an electric power to the amplifier 1406, the demodulation circuit 1405, the logic circuit 1407, the memory control circuit 1408, the memory circuit 1409, the logic circuit 1410, the amplifier 1411, the modulation circuit 1412, and the like. In such a manner, the active type RFID operates.

FIG. 27 shows a block diagram showing a specific structure of a passive-type RFID. In a passive-type RFID 1500 of FIG. 27, a communication signal received by an antenna circuit 1501 is input to a demodulation circuit 1505 and an amplifier 1506 in a signal processing circuit 1502. The communication signal is normally transmitted after processing such as ASK modulation or PSK modulation is performed on carriers of 13.56 MHz, 915 MHz, or the like. In FIG. 27, an example of a case of using 13.56 MHz as a communication signal is shown.

In FIG. 27, a clock signal as a reference is needed in order to process a signal. Here, the carrier of 13.56 MHz is used as a clock. The carrier of 13.56 MHz is amplified by the amplifier 1506 and then supplied to a logic circuit 1507 as a clock. Further, the communication signal that is ASK modulated or PSK modulated is demodulated in the demodulation circuit 1505. The demodulated signal is also transmitted to the logic circuit 1507 and analyzed. The signal analyzed in the logic circuit 1507 is transmitted to a memory control circuit 1508, and based on the signal, the memory control circuit 1508 controls a memory circuit 1509 and retrieves data stored in the memory circuit 1509 to transmit the data to a logic circuit 1510. The data transmitted from the memory circuit 1509 is encoded by the logic circuit 1510, and subsequently amplified by an amplifier 1511. A modulation circuit 1512 modulates the carrier in accordance with the signal. On the other hand, the communication signal in a rectifier circuit 1503 is rectified and input to a power supply circuit 1504. The power supply circuit 1504 supplies an electric power to the amplifier 1506, the demodulation circuit 1505, the logic circuit 1507, the memory control circuit 1508, the memory circuit 1509, the logic circuit 1510, the amplifier 1511, the modulation circuit 1512, and the like. In such a manner, the passive-type RFID operates.

[Reference 1]
Japanese Published Patent Application No. 2005-316724
[Reference 2]
Japanese Translation of PCT International Application No. 2006-503376

DISCLOSURE OF INVENTION

The above conventional semiconductor device having an RFID can obtain information such on whether or not the semiconductor device having an RFID exists in a predetermined space or can obtain information on ID or the like possessed in the RFID in a case where the semiconductor device exists in the predetermined space. However, the conventional semiconductor device having an RFID has a problem in that a position of the semiconductor device having an RFID can not be found in the predetermined space.

Thus, it is an object of the present invention to provide a semiconductor device that communicates data by wireless communication and can detect a distance between the semiconductor device and another device for wireless communication. Further, it is also an object of the present invention to provide a system for detecting a position of a semiconductor device with the use of such a semiconductor device.

In order to solve the foregoing problem, it is a feature of a semiconductor device relating to the present invention to communicate data by wireless communication, to generate a signal showing information on a distance from a source to a destination of a received signal, and to transmit the signal.

For detecting information on a distance, the present invention is implemented by focusing the following event: while a signal is transmitted in a space, electric field intensity is lowered depending on the transmitting distance. A semiconductor device of the present invention has means for oscillating a signal with a frequency corresponding to electric field intensity (a size of amplitude of a signal) of a received signal. When the frequency of the signal that is oscillated by this means is found, a distance between the source of the signal and the semiconductor device can be detected.

Thus, an aspect of the present invention is a semiconductor device including an antenna circuit for transmitting and receiving a signal, a signal oscillating portion for oscillating a signal with a frequency corresponding to electric field intensity of a signal received by the antenna circuit, and a signal processing portion for processing a signal oscillated in the signal oscillating portion, where the antenna circuit transmits a signal that is generated in the signal processing portion.

The signal processing portion has means for counting the number of oscillations of a signal that is oscillated in the signal oscillating portion. Further, the signal processing portion can have means for measuring a time period that is needed for counting, that is, an oscillation time period as well as means for counting the number of oscillations of a signal that is oscillated in the signal oscillating portion.

Another aspect of the present invention is a semiconductor device including an antenna circuit for transmitting and receiving a signal and a signal oscillating portion for oscillating a signal with a frequency corresponding to electric field intensity of a signal received by the antenna circuit, where the antenna circuit transmits a signal that is oscillated in the signal oscillating portion. When the signal transmitted from the antenna circuit is received and a frequency is detected, a distance between the semiconductor device and the source of the signal can be found.

Further, in a semiconductor device of the present invention, the signal oscillating portion includes power supply means for changing a signal received by the antenna circuit into a direct-current voltage and a ring oscillator using an output of the power supply means as power source. According to this structure, a pulse signal can be generated in the signal oscillating portion, which is oscillated with a frequency corresponding to electric field intensity (amplitude) of a signal received by the antenna circuit.

Further, a semiconductor device of the present invention may include an amplifier circuit for amplifying a signal that is transmitted and received by the antenna circuit.

A position detection system can be constituted by a semiconductor device relating to the present invention and a plurality of interrogators that communicate with the semiconductor device wirelessly. The position detection system relating to the present invention has a feature in that means for measuring the number of oscillations of a signal (pulse) and means for measuring an oscillation time period of a signal are provided in order to detect a frequency of a signal that is oscillated in a signal oscillating portion of the semiconductor device.

An aspect of the present invention is a position detection system including a semiconductor device and a plurality of interrogators which communicate with each other wirelessly, where the semiconductor device oscillates a signal with a frequency corresponding to electric field intensity of a received signal. In order to detect a frequency of a signal that is oscillated in the semiconductor device, means for measuring the number of oscillations of a signal is provided for the semiconductor device, and means for measuring an oscillation time period is provided for the interrogator.

More specifically, the semiconductor device is provided with an antenna circuit for transmitting and receiving a signal, a signal oscillating portion for oscillating a signal with a frequency corresponding to electric field intensity of a signal received by the antenna circuit, and a signal processing portion for processing a signal oscillated in a signal oscillating portion. Any one of the plurality of the interrogators transmits a signal for detecting a distance to the semiconductor device. In the semiconductor device, when the signal for detecting a distance is received by the antenna circuit, the signal for detecting a distance is output to the signal oscillating portion and the signal processing portion. In the signal oscillating portion, a signal is generated, which is oscillated with a frequency corresponding to electric field intensity of the signal for detecting a distance, and in the signal processing portion, count of the number of oscillations of a signal oscillated in the signal oscillating portion is started. When a count value reaches a predetermined value, a response signal showing completion of the count is generated in the signal processing portion, and the response signal is transmitted from the antenna circuit. In the interrogator transmitting the signal for detecting a distance, when the response signal is received, a time period from transmission of the signal for detecting a distance to reception of the response signal is detected.

Another aspect of the present invention is a position detection system including a semiconductor device and a plurality of interrogators which communicate wirelessly, where the semiconductor device oscillates a signal with a frequency corresponding to electric field intensity of a received signal. In order to detect a frequency of the signal oscillated in the semiconductor device, both means for measuring the number of oscillations of the signal and means for measuring an oscillating time period of the signal are provided for the semiconductor device.

More specifically, in the position detection system relating to the present invention, the semiconductor device is provided with an antenna circuit for transmitting and receiving a signal, a signal oscillating portion for oscillating a signal with a frequency corresponding to electric field intensity of a signal received by the antenna circuit, and a signal processing portion for processing a signal oscillated in the signal oscillating portion. Any one of the plurality of the interrogators transmits a signal for detecting a distance to the semiconductor device. In the semiconductor device, when the signal for detecting a distance is received by the antenna circuit, the signal for detecting a distance is output to the signal oscillating portion. In the signal oscillating portion, a signal is oscillated with a frequency corresponding to electric field intensity of the signal for detecting a distance. In the signal processing portion, an oscillation frequency and an oscillation time period of a signal oscillated in the signal oscillating portion are measured, a distance between the interrogator and the semiconductor device is detected by the number of oscillations and the oscillation time period, and the detected distance is transmitted to the interrogator.

Another aspect of the present invention is a position detection system including a semiconductor device and a plurality of interrogators which communicate wirelessly, where the semiconductor device oscillates a signal with a frequency corresponding to electric field intensity of a received signal. The semiconductor device has a feature in that the oscillated signal is transmitted to the interrogator so that the frequency is detected by the interrogator.

More specifically, the position detection system relating to the present invention is provided with a plurality of interrogators and a semiconductor device, and the semiconductor device has an antenna circuit for transmitting and receiving a signal and a signal oscillating portion for oscillating a signal with a frequency corresponding to electric field intensity of a signal received by the antenna circuit. Any one of the plurality of the interrogators transmits a signal for detecting a distance. In the semiconductor device, when the signal for detecting a distance is received by the antenna circuit, the signal for detecting a distance is input to the signal oscillating portion. In the signal oscillating portion, a signal is oscillated with a frequency corresponding to electric field intensity of the signal for detecting a distance. The antenna circuit transmits a signal oscillated in the signal oscillating portion. When the interrogator receives a signal from the antenna circuit, the interrogator detects a frequency of the received signal. The interrogator is provided with both means for measuring the number of oscillations of a signal and means for measuring an oscillation time period. Thus, a frequency can be detected.

It is to be noted that the term "connected" means "electrically connected" in the present invention. Therefore, in addition to a predetermined relation of connection, another element (for example, a switch, a transistor, a capacitor element, an inductor, a resistance element, a diode, or the like) which is capable of electrically connection may be provided in the connection, in a structure disclosed in the present invention.

It is to be noted that a semiconductor device in the present specification indicates general devices capable of functioning with the use of semiconductor characteristics.

According to the present invention, a semiconductor device capable of measuring a communication distance by wireless communication can be provided. Therefore, a position detection system can be formed, which detects information on a position where a semiconductor device is located in a space (for example, space coordinates), with the use of the semiconductor device relating to the present invention. A semiconductor device relating to the present invention is attached to equipment, and position information (space coordinates) of the semiconductor device is regularly detected by wireless communication, whereby a track of the equipment can be obtained.

BRIEF DESCRIPTION OF DRAWINGS

FIGS. 18A and 18B are views showing a top view structure and a cross-sectional view structure of a semiconductor device that has an RFID capable of being bent.

FIGS. 22A to 22C are cross-sectional views each explaining a manufacturing step of an element formation layer of a semiconductor device.

FIGS. 23A to 23B are cross-sectional views each explaining a manufacturing step of an element formation layer of a semiconductor device.

BEST MODE FOR CARRYING OUT THE INVENTION

Figure 1:
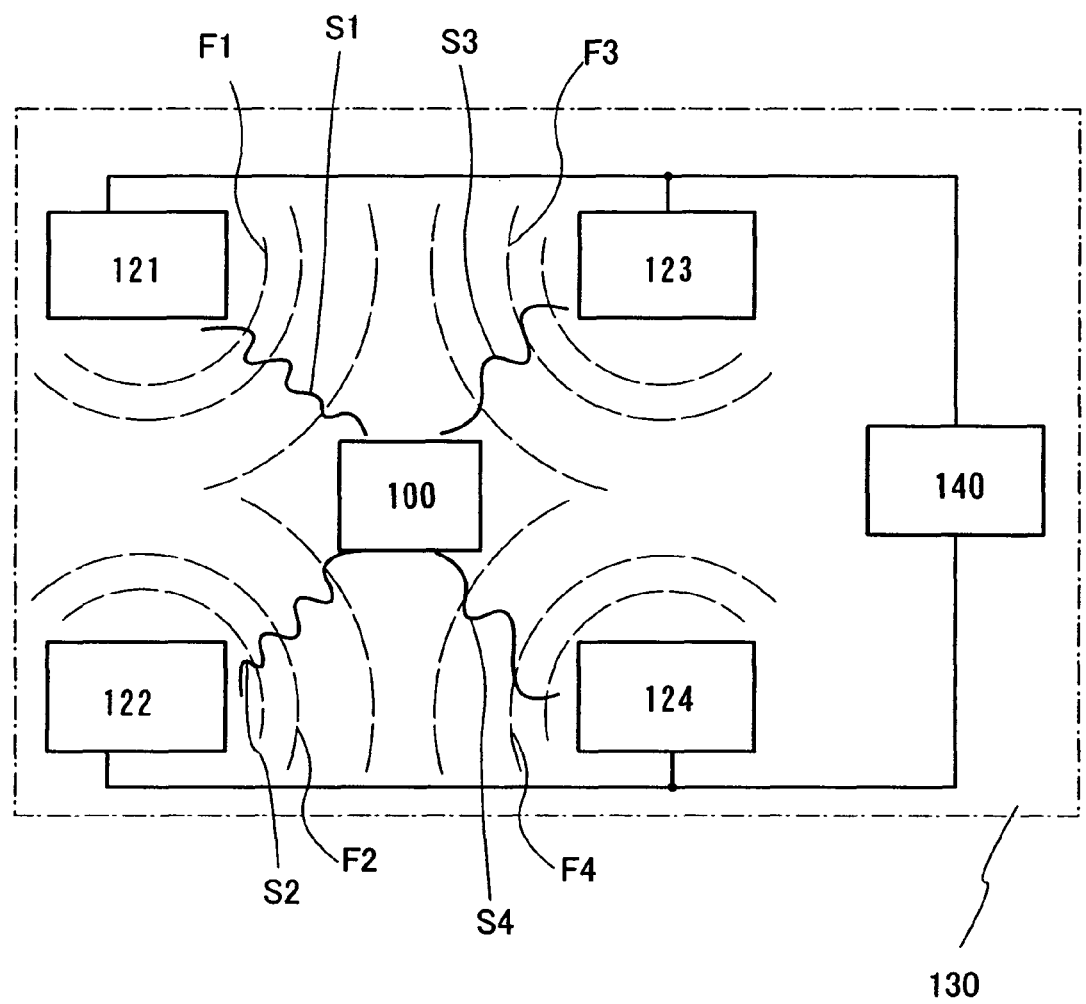
FIG. 1 is a block diagram explaining a structure of a position detection system of the present invention, and transmission and reception of a signal.

Hereinafter, embodiment modes of the present invention will be explained with reference to drawings. However, the present invention is easily understood by those skilled in the art that various changes and modifications are possible, unless such changes and modifications depart from the content and the scope of the invention. Therefore, the present invention is not construed as being limited to the description of the following embodiment modes. It is to be noted that the same portion or a portion having the same function is denoted by the same reference numeral in all the drawings for explaining embodiment modes, and the explanation thereof is omitted.

The present invention is to detect a distance between an RFID and an interrogator and a position of the RFID by utilizing reduction in electric field intensity in accordance with a transmitting distance of a signal in transmitting the signal in a space. Hereinafter, the present invention will be explained on the conduction such that electric field intensity of a signal output from an interrogator is spherically spread by regarding the interrogator as a center and the electric field intensity is reduced as the distance from the interrogator is increased in the present specification.

Embodiment Mode 1

In this embodiment mode, a structure of a semiconductor device of the present invention and a structure of a position detection system of the present invention using the semiconductor device will be explained.

A position detection system of the present invention is to detect a position of a semiconductor device that has an RFID by communication of an interrogator and the semiconductor device. FIG. 1 is a block diagram for explaining a structure of a position detection system of the present invention and transmission and reception of a signal in the system. The system of FIG. 1 is for detecting a position of a semiconductor device that has an RFID in a space 130. The semiconductor device that has an RFID performs wireless communication, and hereinafter, is referred to as an "RFID".

As shown in FIG. 1, an RFID 100 is located to be surrounded by an interrogator 121, an interrogator 122, an interrogator 123, and an interrogator 124. As a matter of course, the number of the interrogators is not limited to 4 in the present invention. In order to detect a position of the RFID 100 in a three-dimensional space, at least four interrogators are necessary. This point is described later. When a two-dimensional coordinate is desired to be detected for detecting a position of the RFID 100, at least three interrogators are necessary. Further, when only a distance between the RFID 100 and the interrogator is measured, at least one interrogator is necessary.

The interrogator 121, the interrogator 122, the interrogator 123, and the interrogator 124 are connected to a server 140 with a LAN (local area network) or the like. The server 140 is a control portion of the system for controlling the interrogators 121 to 124 or for detecting a position of an RFID based on a signal from the interrogators 121 to 124. A connection of the server 140 with the interrogators 121 to 124 and a connection between the interrogators 121 to 124 can be constituted by a wired network or a wireless network.

In the present specification, the interrogator (also referred to as a reader/writer device or a R/W device) outputs a signal which is being placed on a carrier and has a function for transmitting and receiving a signal to/from the RFID wirelessly. Here, a frequency of the carrier is not limited to a specific frequency.

The interrogator 121, the interrogator 122, the interrogator 123, and the interrogator 124 each outputs a signal for detecting a distance having equivalent electric field intensity. Hereinafter, these signals are described as a signal F1, a signal F2, a signal F3, or a signal F4 (see FIG. 1). When a distance between the RFID 100 and the specific interrogator or a position of the RFID 100 is measured, the interrogator 121, the interrogator 122, the interrogator 123, and the interrogator 124 sequentially transmit the signal F1, the signal F2, the signal F3, and the signal F4, respectively, so that the signals F1 to F4 are not received in the RFID at the same time from a plurality of interrogators. Timing for transmitting the signals F1 to F4 from the interrogators 121 to 124 is controlled by the server 140.

Figure 2:
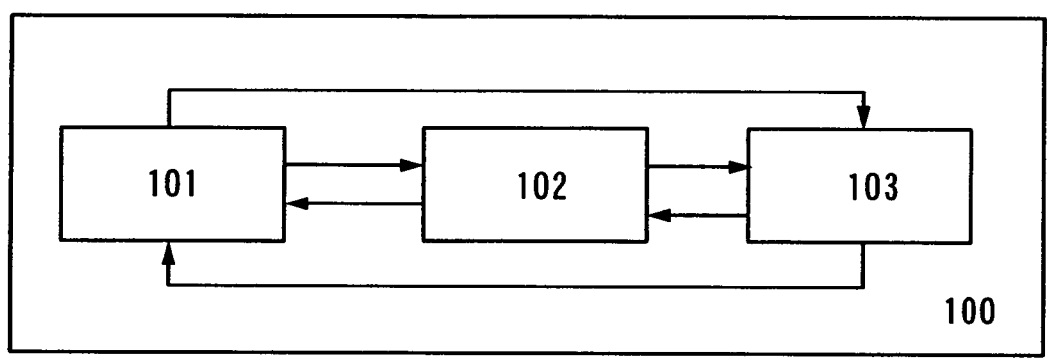
FIG. 2 is a block diagram showing a structure of a semiconductor device performing wireless communication of the present invention.

The RFID 100 has a function in which the signals F1 to F4 transmitted from the interrogators 121 to 124 are received and signals S1 to S4 that are generated by reception of the signals F1 to F4 are transmitted. FIG. 2 is a block diagram showing a basic structure of the RFID 100 relating to the present invention. A semiconductor device that has an RFID (hereinafter, referred to as an "RFID") in FIG. 2 includes an antenna circuit 101, a signal oscillating portion 102, and a signal processing portion 103.

As shown in FIG. 2, a signal is input and output to/from the antenna circuit 101 and the signal oscillating portion 102, and a signal is input and output between the signal oscillating portion 102 and the signal processing portion 103. The antenna circuit 101 receives a signal from the outside or transmits a signal to the outside. That is, the signals F1 to F4 from the interrogators 121 to 124 shown in FIG. 1 are received by the antenna circuit 101, and the signals S1 to S4 are transmitted from the antenna circuit 101.

The signal oscillating portion 102 has a function for oscillating a pulse signal to be output based on the signal received by the antenna circuit 101. Therefore, the signal oscillating portion 102 has a pulse oscillating circuit. The pulse oscillating circuit has a function in which pulse signals with different frequencies from each other can be oscillated depending on a voltage of the input signal. Such a pulse oscillating circuit can be constituted by, for example, a rectifier circuit and a ring oscillating circuit in which a signal from the rectifier circuit is input.

Figure 4:
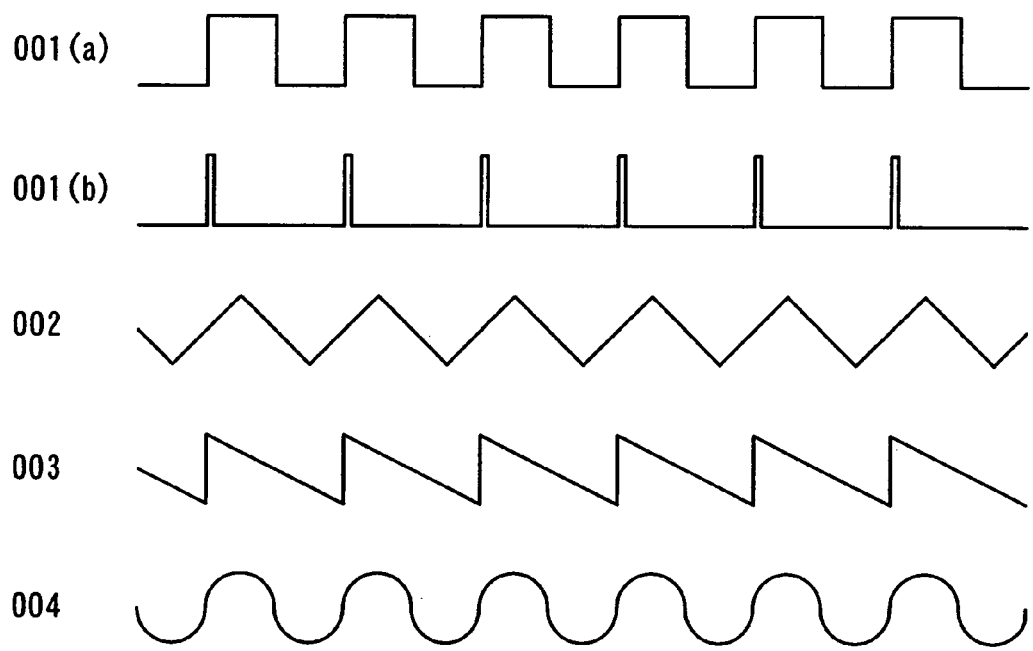
FIG. 4 is a waveform chart illustrating examples of a pulse signal.

It is to be noted that the pulse signal in the present specification indicates a signal in which a voltage is periodically changed. A pulse signal is illustrated by examples in FIG. 4. For example, the pulse signal indicates a wave in which a voltage swings periodically to have such a shape as a rectangular wave 001(a), a rectangular wave 001(b), a triangular wave 002, a sawtooth wave 003, or a sine wave 004 shown in FIG. 4.

The signal processing portion 103 has a function for counting a pulse of the pulse signal output from the signal oscillating portion 102. Therefore, the signal processing portion 103 is provided with a counter for counting a pulse of the output pulse signal from the signal oscillating portion 102.

A shape of the antenna in the antenna circuit 101 is not particularly limited. That is, as a transmission system of a signal that is applied to the antenna circuit 101 in the RFID 100, an electromagnetic coupling system, an electromagnetic induction system, a micro-wave system, or the like can be used. The transmission system may be selected by a practitioner appropriately in consideration of usage, and an antenna having an optimal length and shape may be provided in accordance with the transmission system.

For example, in a case where an electromagnetic coupling system or an electromagnetic induction system (for example, 13.56 MHz band) is applied as a transmission system, electromagnetic induction by change of the electric field density is utilized; therefore, a conductive film serving as an antenna is formed into a circular shape (such as a loop antenna) or a spiral shape (such as a spiral antenna).

In a case where a micro-wave system (for example, UHF band (860 to 960 MHz band), 2.45 GHz band, or the like) is applied as the transmission system, a length or a shape of a conductive film serving as an antenna may be selected as appropriate in consideration of a wavelength of an electric wave used for signal transmission. For example, the conductive film serving as an antenna can be formed into a linear shape (such as a dipole antenna), a flat shape (such as a patch antenna), or the like. Further, a shape of the conductive film serving as an antenna is not limited to the linear shape, and the conductive film may be formed into a curve, a meandering shape, or a combined shape thereof in consideration of a wavelength of an electromagnetic wave.

Figure 26:
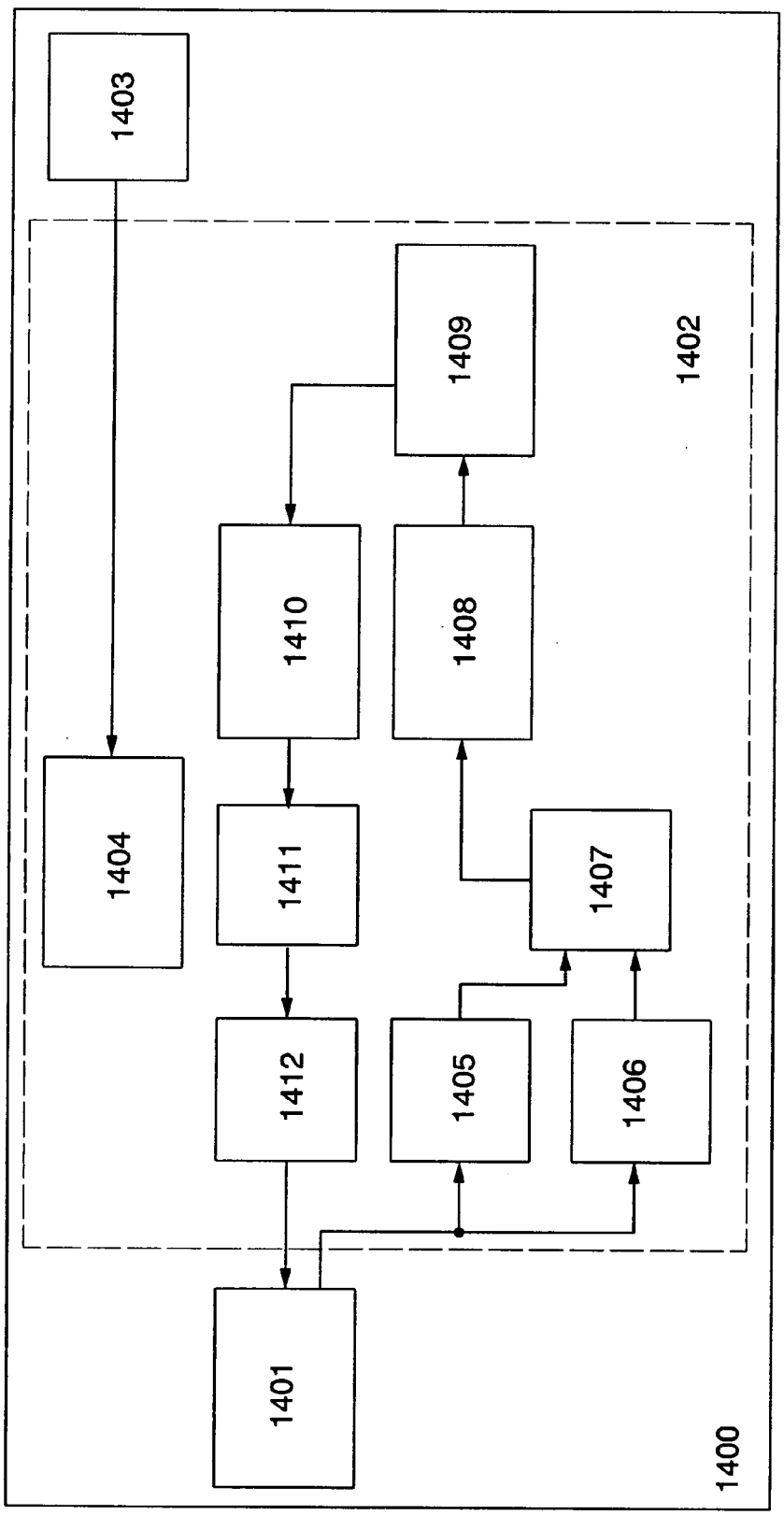
FIG. 26 is a block diagram of a conventional RFID.
Figure 27:
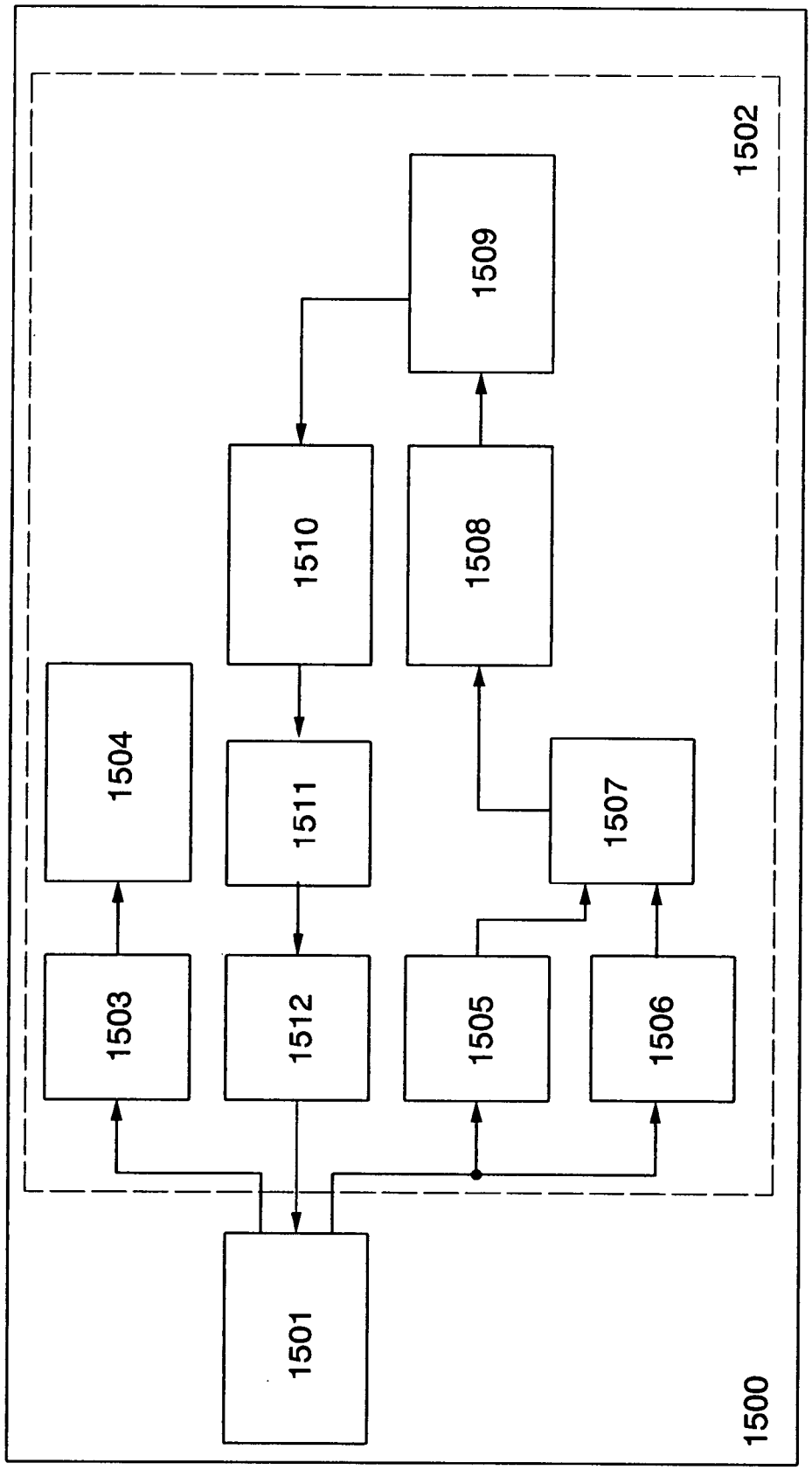
FIG. 27 is a block diagram of a conventional RFID.

The RFID 100 may be provided with an amplifier circuit for amplifying a signal transmitted and received in the antenna circuit 101. The RFID 100 may have a structure of either of an active type or a passive type. For example, in a case of an active-type structure, as similar to a conventional example of FIG. 26, the RFID is further provided with a cell, and a power supply circuit is provided in the signal oscillating portion 102. In a case of a passive-type structure, as similar to a conventional example of FIG. 27, a rectifier circuit and a power supply circuit may be provided in the signal oscillating portion 102 because the power supply is generated from the signal received by the antenna circuit 101.

The present invention is to detect a distance between the RFID and the interrogator and a position of the RFID by utilizing reduction in electric field intensity in accordance with the transmission distance of a signal in transmitting the signal in the space.

Figure 3:
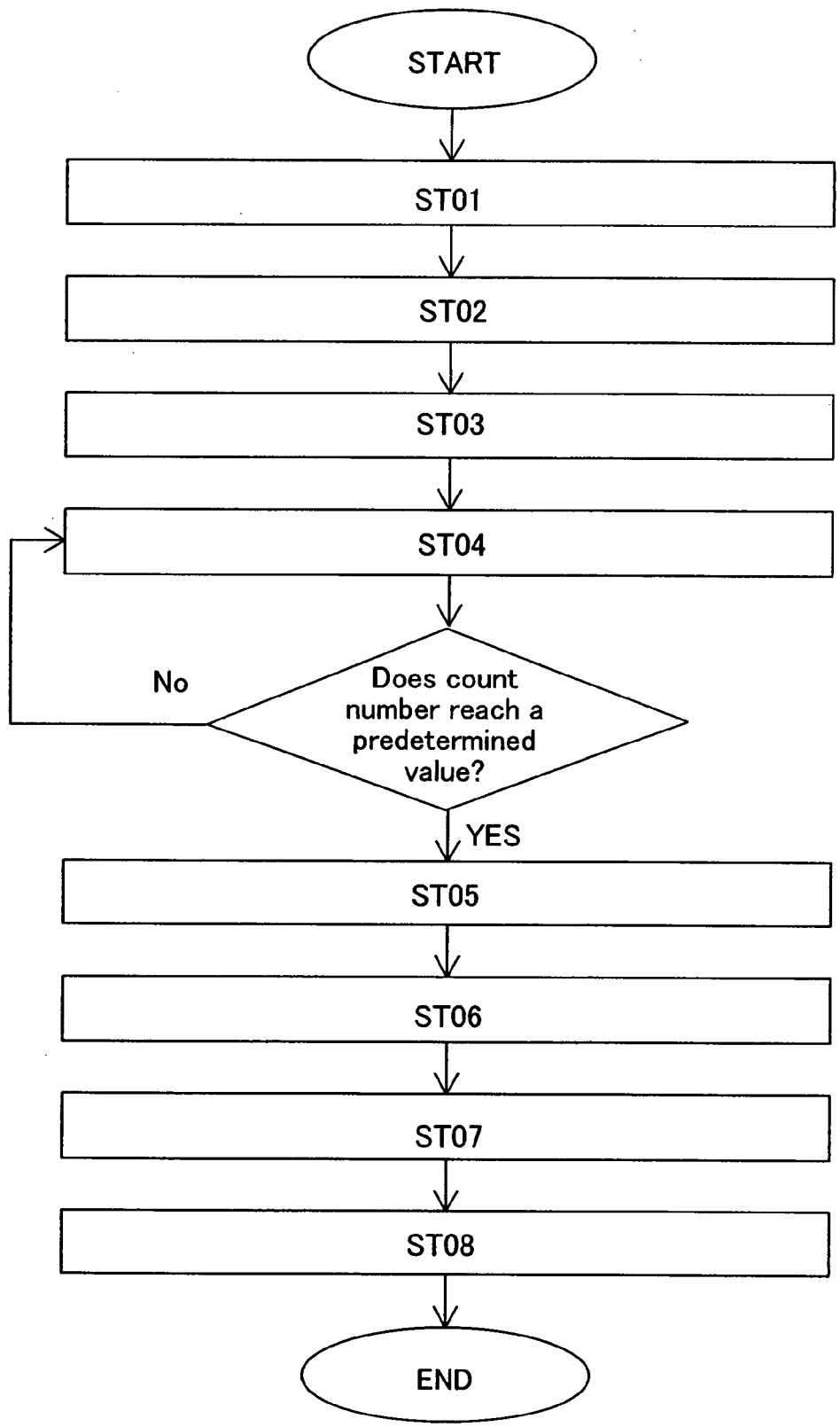
FIG. 3 is a flow chart explaining operation of the position detection system of FIG. 1.

Operation of the position detection system shown in FIG. 1 is explained with the use of a flow chart shown in FIG. 3. Although the number of interrogators is not limited to 4 in the present invention, the number of the interrogators is limited to 4 for convenience of explanation, and flow of the position detection system of the present invention is explained. This point is similar to the other embodiment modes.

First, in order to detect a distance between the RFID 100 and the first interrogator 121, the first interrogator 121 outputs the signal F1 (step ST01). The RFID 100 receives the signal F1 from the interrogator 121 by the antenna circuit 101 (step ST02).

The signal F1 received by the antenna circuit 101 is output to the signal oscillating portion 102. In the signal oscillating portion 102, a pulse signal is generated, which is oscillated with a frequency corresponding to electric filed intensity of the input signal F1 (step ST03). The signal F1 received by the antenna circuit 101 is rectified and then smoothed to generate a direct-current voltage, and the pulse signal is oscillated by an oscillating circuit using this direct-current voltage as a power source, whereby such a pulse signal can be generated.

The pulse signal oscillated in the signal oscillating portion 102 is input to the signal processing portion 103. In the signal processing portion 103, the pulse number of the pulse signal is counted until a predetermined value is obtained (step ST04).

When the count number reaches a predetermined value, a signal (a response signal S1) showing completion of the count of the pulse is generated in the signal processing portion 103 (step ST05). The response signal S1 is output from the signal processing portion 103 to the antenna circuit 101. The response signal S1 is transmitted from the antenna circuit 101 (step ST06). The interrogator 121 receives the response signal S1 from the RFID 100 (step ST07). When the response signal S1 is received, the interrogator 121 detects a time period T1 from the transmission of the signal F1 to reception of the response signal S1 (step ST08). Here, this time period T1 is referred to as a response time period T1.

It is to be noted that the response time period T1 is determined by the oscillation frequency of the pulse signal that is oscillated in the signal oscillating portion 102 of the RFID 100. Further, the oscillation frequency of the pulse signal is determined depending on electric field intensity of the signal F1 at the time of being received in the RFID 100. The electric field intensity of the signal F1 at the time of being received in the RFID 100 is determined depending on the distance between the RFID 100 and the first interrogator 121. As the distance between the RFID 100 and the interrogator 121 increases, the electric field intensity of the signal F1 at the time of being received in the RFID 100 becomes lower; therefore, the oscillation frequency of the pulse signal is reduced. As a result, the time period needed for counting the pulse in the signal oscillating portion 102 is extended, and the response time period T1 that is measured by the interrogator 121 becomes longer. Thus, the response time period T1 that is measured by the interrogator 121 corresponds to the frequency of the pulse signal that is oscillated in the signal oscillating portion 102; therefore, a distance between the RFID 100 and the interrogator 121 can be detected from the response time period T1.

Operation from the step ST01 to the step ST08 are sequentially performed in each case of the second interrogator 122, the third interrogator 123, and the fourth interrogator 124, and a response time period T2, a response time period T3, and a response time period T4 are detected in the case of the interrogator 122, the interrogator 123, and the interrogator 124, respectively. Selection of the interrogator for communicating with the RFID 100 is controlled by an instruction from the server 140. For specifying a position of the RFID 100 with the three-dimensional coordinate, the response time period may be measured by at least four interrogators; therefore, in a case where five or more interrogators are set in the space 130, all interrogators are not necessary to be used for measuring the response time period.

The interrogator 121, the interrogator 122, the interrogator 123, and the interrogator 124, which are provided in the space 130, transmit the measured response time periods T1, T2, T3, and T4 to the server 140 through the LAN (local area network) or the like. The server 140 calculates a distance D1, a distance D2, a distance D3, and a distance D4 between each interrogator 121 to 124 and the RFID 100 based on the response time periods T1 to T4 that are transmitted from the interrogators 121 to 124. A position (space coordinates) of the RFID 100 can be specified by the distances D1 to D4 and the position information (space coordinates, more specifically, a relative coordinate) of the interrogators 121 to 124.

Figure 5:
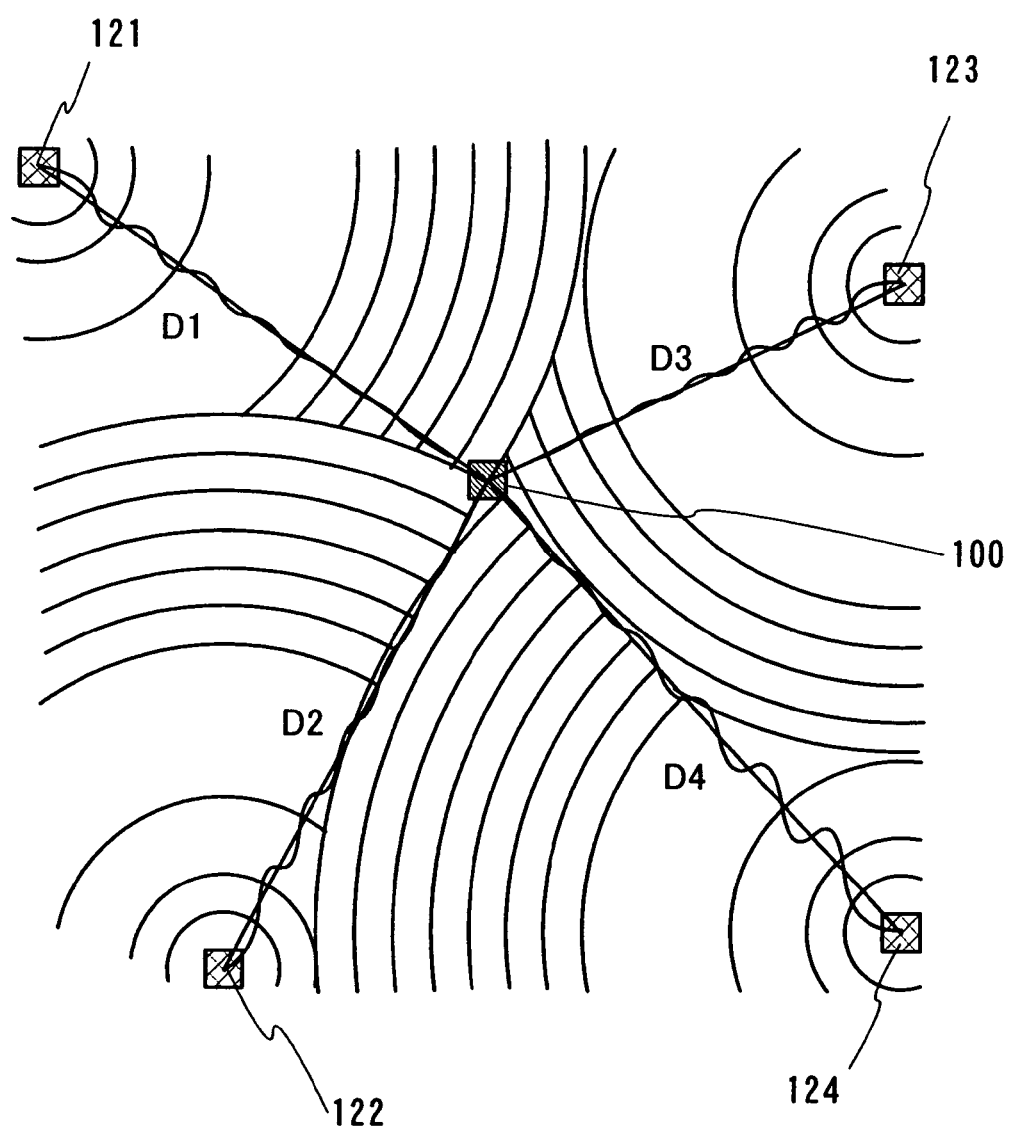
FIG. 5 is a view explaining a principle for detecting a position of a semiconductor device by a distance between an interrogator and the semiconductor device in a position detection system.

Explanation that a position of the RFID can be specified using at least four interrogators is performed with reference to FIG. 5. In the space 130, there are four spheres of each radius which corresponds to the distance D1, the distance D2, the distance D3, or the distance D4, by regarding each coordinate of the interrogators 121 to 124 as a center. An intersection point of the four spheres is determined at one point, and the intersection point becomes a coordinate of the RFID 100.

As described above, the distance between the interrogator and the RFID 100 is measured, whereby the position of the RFID 100 in the space 130 can be detected. A manager can find a position where the RFID 100 is located by access to the server 140.

When the above structure of the present invention is employed, information on a position where the RFID is located in the space can be obtained as well as individual information such as ID included in the RFID. Further, the position information of the RFID is regularly detected, whereby information on following a track (also referred to as a flow line) of movement of equipment provided with the RFID can be obtained.

Embodiment Mode 2

In Embodiment Mode 1, in order to detect the oscillation frequency of a signal that is oscillated in the signal oscillating portion 102, only count of a pulse of a pulse signal that is oscillated in the signal oscillating portion 102 is performed in the signal processing portion 103, and a time period needed for counting a pulse is detected by the interrogator. A position detection system in this embodiment mode has a feature in that the number of oscillations of a pulse signal is counted and an oscillation time period is detected in a signal processing portion. It is to be noted that a structure of a position detection system and an RFID 100 is similar to those of Embodiment Mode 1 (see FIG. 1 and FIG. 2). Therefore, portions different from those of Embodiment Mode 1 will be explained, and the explanation in Embodiment mode 1 is applied for the similar portions.

Figure 6:
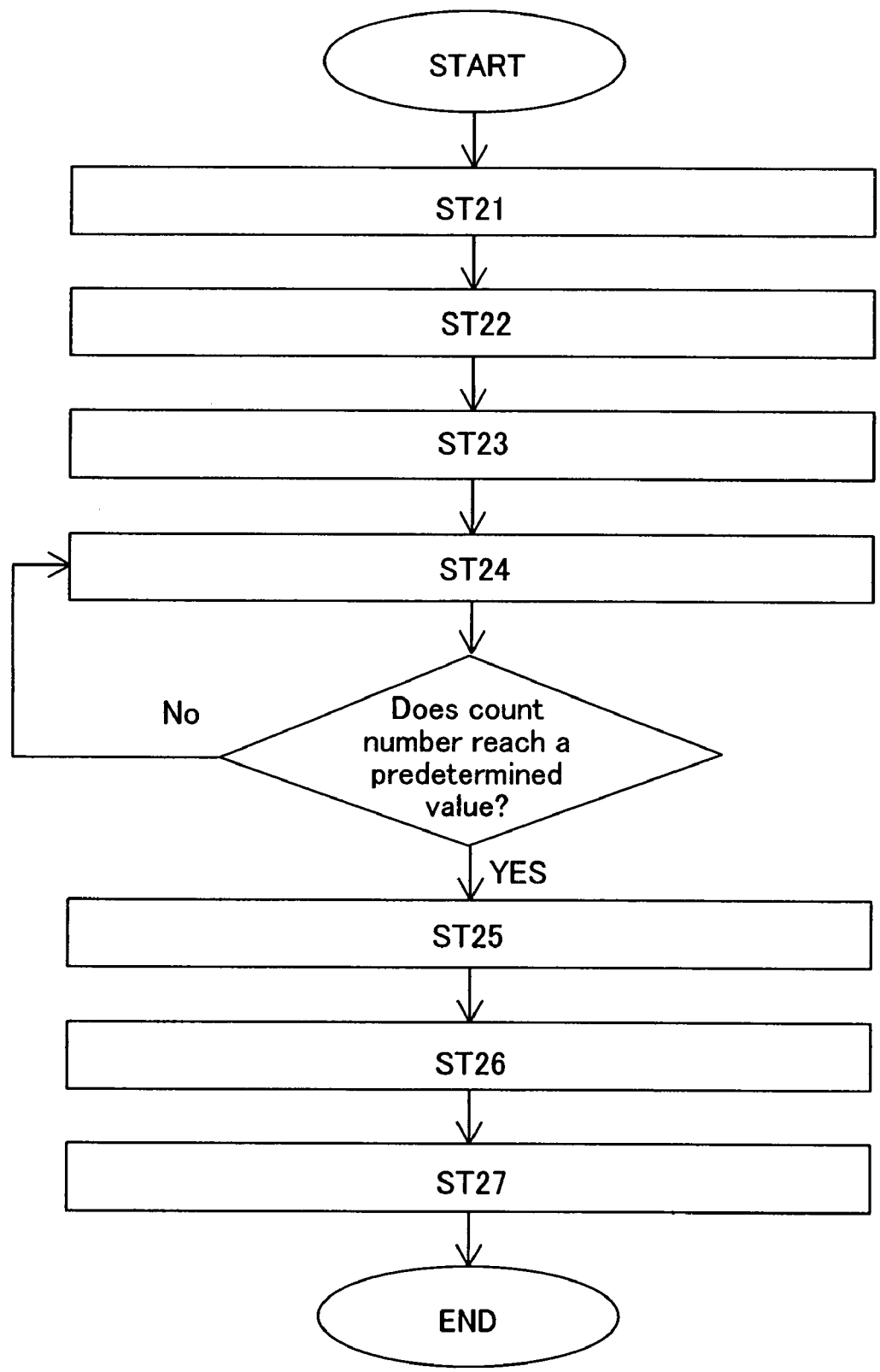
FIG. 6 is a flow chart explaining operation of a position detection system of FIG. 1.

FIG. 6 shows a flow chart for explaining operation of the position detection system of this embodiment mode. First, a distance between an RFID 100 and a first interrogator 121 is detected. Therefore, communication is performed between the first interrogator 121 and the RFID 100. Steps ST21 to ST24 are similar to the steps ST01 to ST04 (see FIG. 3) in Embodiment Mode 1.

First, the first interrogator 121 outputs a signal F1 (the step ST21). The signal F1 from the interrogator 121 is received in an antenna circuit 101 of the RFID 100 (the step ST22). The signal F1 is input from the antenna circuit 101 to a signal oscillating portion 102. In the signal oscillating portion 102, a pulse signal is generated, which is oscillated with a frequency corresponding to electric field intensity of the input signal F1 (the step ST23). In a signal processing portion 103, a pulse of the pulse signal that is oscillated in the signal oscillating portion 102 is counted until a predetermined value is obtained (the step ST24).

In this embodiment mode, means for measuring a time period is provided for the signal processing portion 103. As the means for measuring a time period, for example, means for generating a reference clock signal and counting means for counting a reference clock signal can be used. A time period can be measured from the count number of the reference clock.

In the signal processing portion 103, after the number of oscillations of the pulse signal that is oscillated in the signal oscillating portion 102 starts to be counted, a time period is measured until the count number reaches a predetermined value. As described in Embodiment Mode 1, the time period that is needed for count in the step ST24 reflects a frequency of the pulse signal that is oscillated in the signal oscillating portion 102 and also reflects a distance between the RFID 100 and the interrogator 121 that is a source of the signal F1. In the signal processing portion 103, a distance between the RFID 100 and the interrogator 121 is detected based on the time period that is needed for counting the pulse in the step ST24 (a step ST25).

A data of the distance detected in the signal processing portion 103 is transmitted as a signal S1 from the antenna circuit 101 (step ST26). The first interrogator 121 receives a signal S1 (step ST27).

Operation from the step ST21 to the step ST27 is sequentially performed in each case of a second interrogator 122, a third interrogator 123, and a fourth interrogator 124. A signal S2, a signal S3, and a signal S4, which show a distance, are received by the interrogator 122, the interrogator 123, and the interrogator 124, respectively. The interrogator 121, the interrogator 122, the interrogator 123, and the interrogator 124, which are located in a space 130, transmit the data of the distance to a server 140. The server 140 specifies a position (space coordinates) of the RFID 100 from the distance data that is received from the interrogators 121 to 124 and position information (space coordinates, more specifically, a relative coordinate) of the interrogators 121 to 124. A manager can find a position where the RFID 100 is located by access to the server 140.

When the above structure of the present invention is employed, information on a position where the RFID is located in the space can be obtained as well as individual information such as ID included in the RFID. Further, the position information of the RFID is regularly detected, whereby information on following a track (also referred to as a flow line) of movement of equipment provided with the RFID can be obtained.

Embodiment Mode 3

In this embodiment mode, another structure of a semiconductor device that has the RFID shown in Embodiment Mode 1 will be explained. In the drawings used in this embodiment mode, the same reference numerals as those of Embodiment Mode 1 denote the same portions. Explanation in Embodiment Mode 1 is applied for details of such portions in this embodiment mode.

Figure 7:
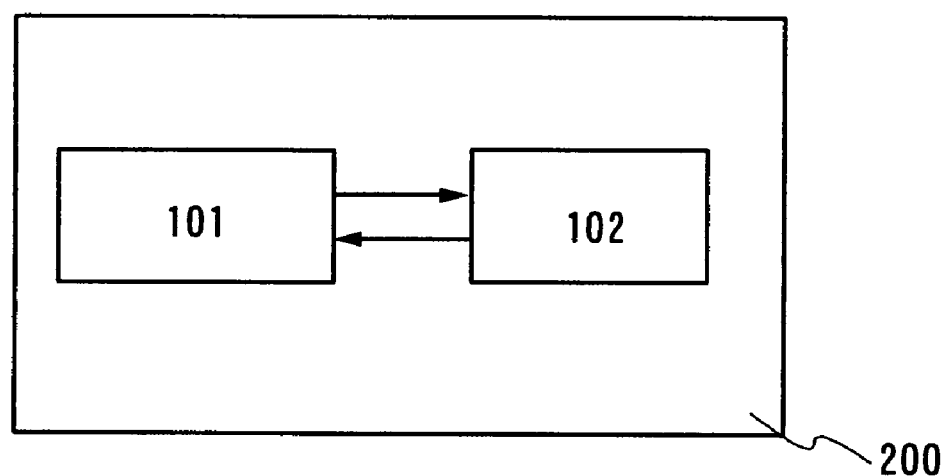
FIG. 7 is a block diagram showing a structure of a semiconductor device performing wireless communication of the present invention.

FIG. 7 is a block diagram showing a structure of a semiconductor device that has an RFID of this embodiment mode (hereinafter, referred to as "RFID"). An RFID 200 of this embodiment mode has such a structure in which the signal processing portion 103 is removed from the RFID 100 of FIG. 2. The RFID 200 includes an antenna circuit 101 and a signal oscillating portion 102.

As the result of removing the signal processing portion 103, a circuit size of the entire RFID 200 can be reduced, and then low power consumption of the entire RFID 200 can be achieved. As a distance between an interrogator and the semiconductor device that has an RFID becomes larger, attenuation of a signal transmitted from the interrogator to the semiconductor device occurs. In such a case, power consumption of the entire RFID 200 is reduced, whereby stable oscillation can be performed in the signal oscillating portion 102.

Figure 8:
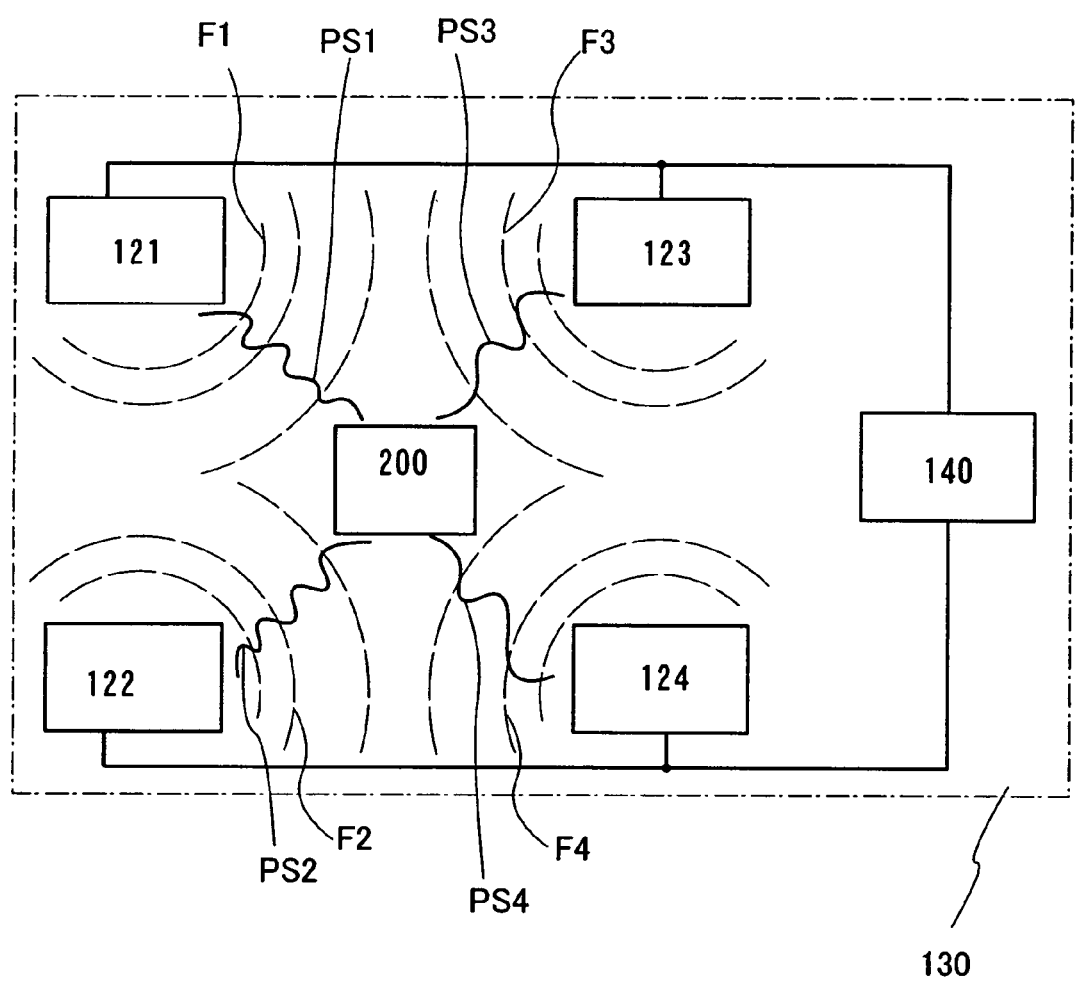
FIG. 8 is a block diagram explaining a structure of a position detection system of the present invention and transmission and reception of a signal.

FIG. 8 is a block diagram for explaining a structure of a position detection system of this embodiment mode and transmission and reception of a signal. As shown in FIG. 8, the RFID 200 of this embodiment mode can form a position detection system similarly to the RFID 100 of Embodiment Mode 1. In the RFID 200 of this embodiment mode, pulse signals PS1 to PS4 oscillated in the signal oscillating portion 102 are transmitted with respect to signals F1 to F4 from interrogators, which is a different point from the RFID 100 of Embodiment Modes 1 and 2.

Figure 9:
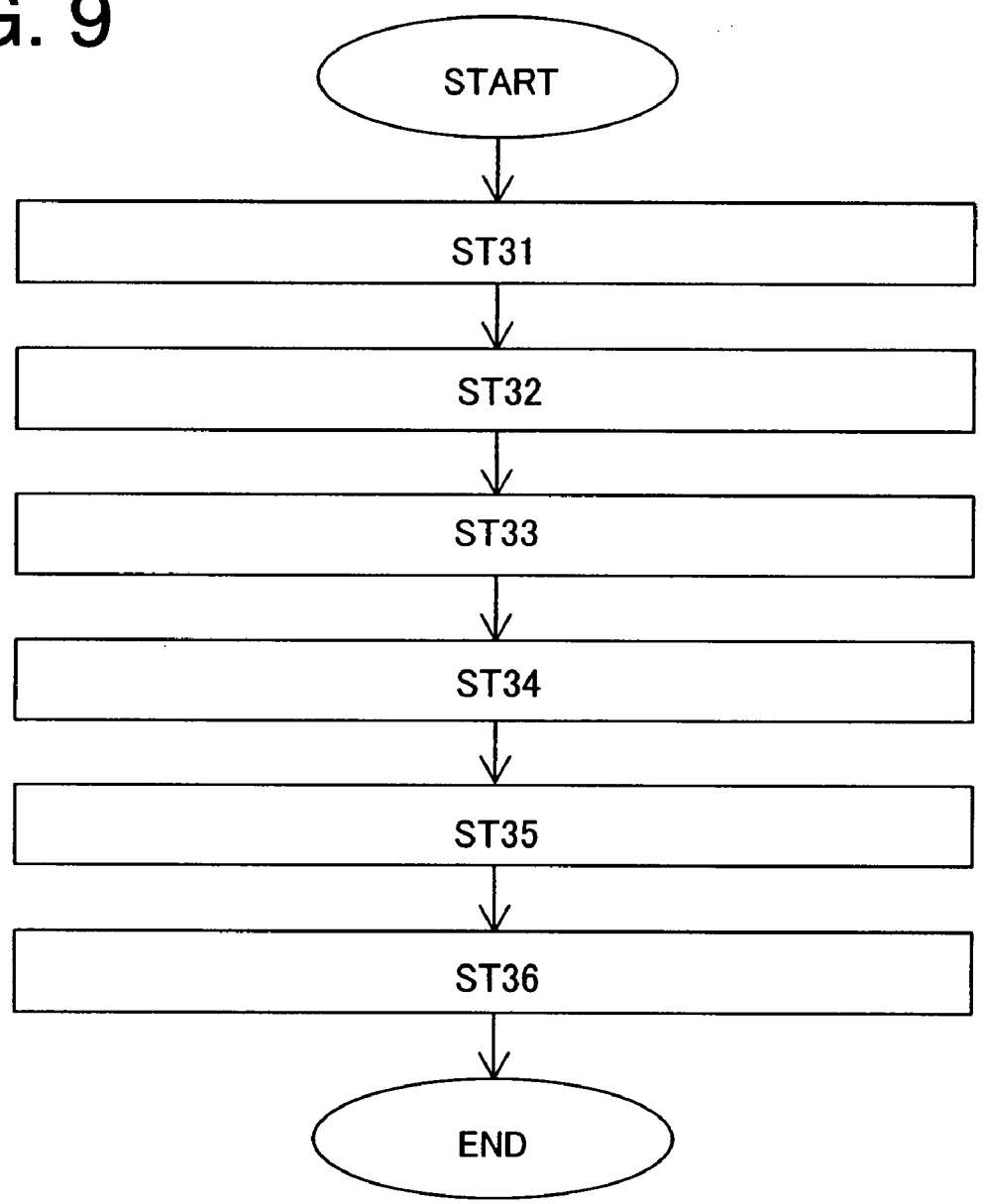
FIG. 9 is a flow chart explaining operation of the position detection system of FIG. 7.

Next, operation of a position detection system of this embodiment mode will be explained with reference to FIG. 9. FIG. 9 is a flow chart for explaining communication of the RFID 200 and a first interrogator 121. Steps ST31 to ST33 by oscillating a pulse signal in the RFID 200 are similar to the steps ST01 to ST03 (see FIG. 3) of Embodiment Mode 1.

First, in order to measure a distance between the RFID 200 and the first interrogator 121, the first interrogator 121 outputs a signal F1 (the step ST31). The signal F1 from the interrogator 121 is received by the antenna circuit 101 of the RFID 200 (the step ST32). The signal F1 is input from the antenna circuit 101 to the signal oscillating portion 102. In the signal oscillating portion 102, the pulse signal PS1 is generated, which is oscillated with a frequency corresponding to electric field intensity (amplitude) of the input signal F1 (the step ST33).

Next, the pulse signal PS1 that is oscillated in the signal oscillating portion 102 of the RFID 200 is output to the antenna circuit 101, and then the pulse signal PS1 is transmitted from the antenna circuit 101 (step ST34). The pulse signal PS1 is received by the first interrogator 121 (step ST35). In the interrogator 121, a frequency of the received pulse signal PS1 is detected (step ST36).

Operation from the step ST31 to the step ST36 is similarly performed in each case of a second interrogator 122, a third interrogator 123, and a fourth interrogator 124. A pulses signal PS2, a pulse signal PS3, and a pulse signal PS4 are received, which correspond to signals transmitted by the interrogator 122, the interrogator 123, and the interrogator 124, respectively, and each frequency thereof is detected.

Data corresponding to each frequency detected from the interrogators 121 to 124 is transmitted to a server 140. As described in Embodiment Mode 1, the frequency of the pule signal PS that is oscillated in the signal oscillating portion 102 reflects a distance between the interrogator and the RFID 200. Therefore, the server 140 can calculate distances between the RFID 200 and each interrogator 121 to 124 based on the data received from each interrogator 121 to 124, and can detect a position (space coordinates) of the RFID based on the calculated distances and position information (space coordinates, more specifically, a relative coordinate) of the interrogators 121 to 124. A manager can find a position where the RFID 200 is located by access to the server 140.

An example of a method for detecting the oscillation frequency of a pulse signal PS by an interrogator is explained. The pulse number of the pulse signal PS is counted by the interrogator until a predetermined value is obtained, and a time period that is needed for counting the pulse is measured. As described in Embodiment Mode 1, since the time period that is needed for counting the pulse corresponds to a frequency, a frequency of the pulse signal PS can be detected by the interrogator by this method. The interrogator transmits the measured time period to the server 140 as data of the oscillation frequency.

When the above structure of the present invention is employed, information on a position where the RFID is located in the space can be obtained as well as individual information such as ID included in the RFID. Further, the position information of the RFID is regularly detected, whereby information on following a track (also referred to as a flow line) of movement of equipment provided with the RFID can be obtained.

Embodiment Mode 4

In this embodiment mode, a more specific structure of the RFID 100 that is applied to the position detection system of Embodiment Mode 1 will be explained. It is to be noted that the similar structure to Embodiment Mode 1 is explained briefly, and explanation of Embodiment Mode 1 is applied for the details of the structure in this embodiment mode.

Figure 10:
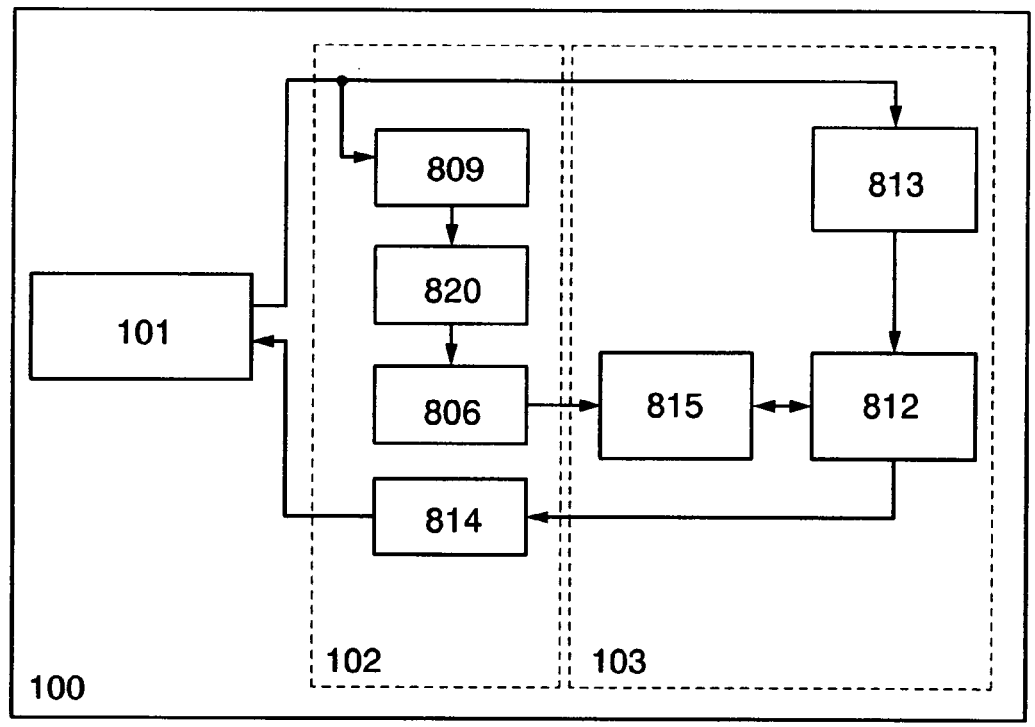
FIG. 10 is a block diagram showing a structure of a semiconductor device performing wireless communication of the present invention.

FIG. 10 is a block diagram of an RFID of this embodiment mode. As shown in FIG. 10, the RFID 100 mainly includes an antenna circuit 101, a signal oscillating portion 102, and a signal processing portion 103 similarly to FIG. 2.

The signal oscillating portion 102 has a rectifier circuit 809 to which a received signal of the antenna circuit 101 is input, a power supply circuit 820 to which an output signal of the rectifier circuit is input, and an oscillation circuit 806 that is connected to an output of the power supply circuit 820. In addition, the signal oscillating portion 102 has a modulation circuit 814 that modulates a signal from the signal processing portion 103 and outputs the modulated signal to the antenna circuit 101.

The oscillating circuit 806 includes a ring oscillator in which a plurality of inverters are connected in a circular manner. In the rectifier circuit 809, the output signal from the antenna circuit 101 is half-wave rectified. The direct-current signal by rectification is smoothed in the power supply circuit 820, and a direct-current voltage corresponding to amplitude of the output signal from the antenna circuit 101 is generated. In the oscillating circuit 806, a pulse signal is oscillated with a frequency corresponding to a voltage value of the direct-current voltage generated in the power supply circuit 820, which is used as a power source. In such a manner, in the signal oscillating portion 102, a pulse signal can be generated, which is oscillated with a frequency corresponding to electric field intensity (amplitude) of the output signal from the antenna circuit 101.

The signal processing portion 103 has a demodulation circuit 813, a logic circuit 812, and a pulse counter 815. After the output signal from the antenna circuit 101 is demodulated in the demodulation circuit 813, the demodulated signal is input to the logic circuit 812. The output signal from the logic circuit 812 is modulated in the modulation circuit 814, and then the modulated signal is input to the antenna circuit 101. The pulse counter 815 is a circuit for measuring pulses (number of oscillations) of a pulse signal that is oscillated in the oscillating circuit 806.

Figure 11:
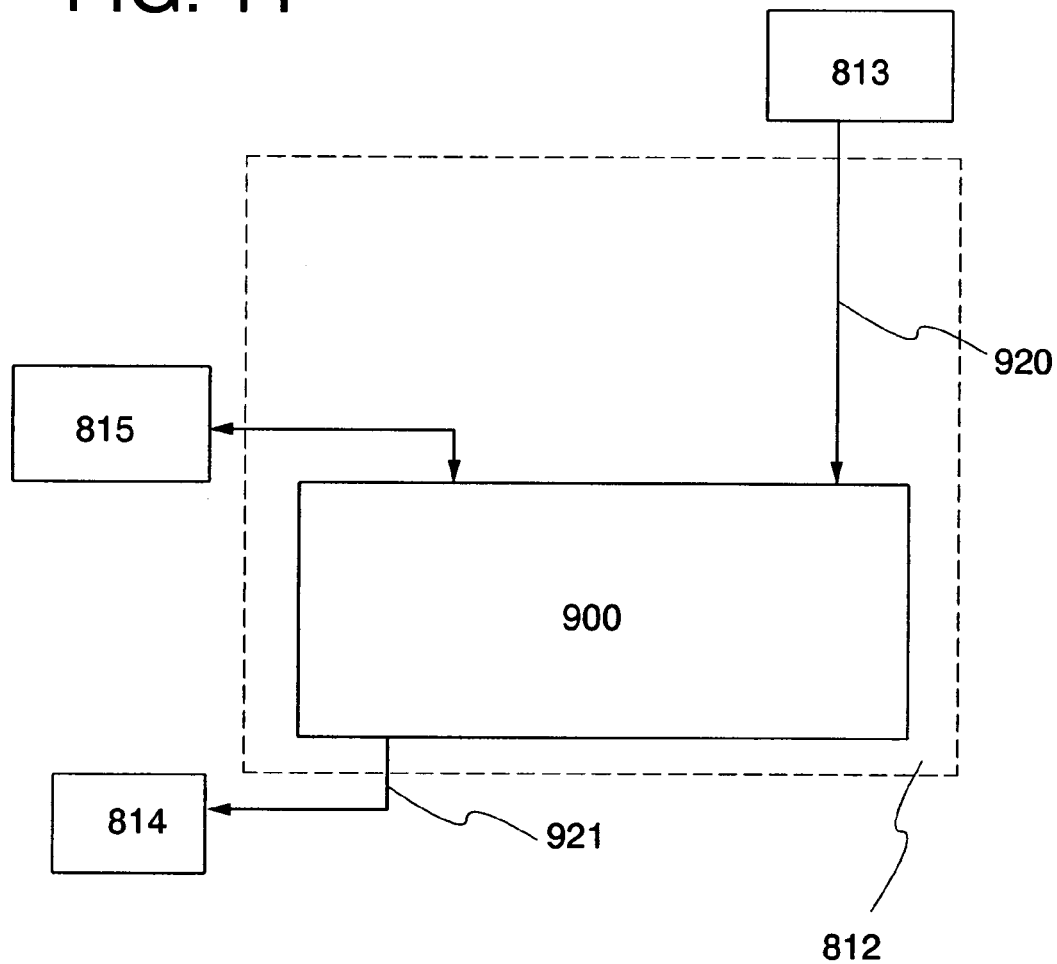
FIG. 11 is a block circuit diagram of a logic circuit 812 of FIG. 10.

The logic circuit 812 is for decoding the signal from the interrogator, which is input through the demodulation circuit 813, and for making a decision as the RFID 100. FIG. 11 shows a block diagram of the logic circuit 812. As shown in FIG. 11, the logic circuit 812 has a controller 900. The controller 900 controls the pulse counter 815 or decodes a signal 920 to output a predetermined signal 921 to the modulation circuit 814, based on the signal 920 demodulated in the demodulation circuit 813.

It is to be noted that the logic circuit 812 of this embodiment mode can be provided with a CPU. The CPU may be provided so that an input and output thereof is connected to the controller 900. When the CPU is provided, the program can be executed. As a result, the RFID 100 can be applied to various use application in addition to position detection.

Hereinafter, operation of a position detection system using a semiconductor device of this embodiment mode will be explained. Operation of the position detection system in this embodiment mode is similar to that of Embodiment Mode 1 (see FIG. 3).

First, in order to search a distance between a first interrogator 121 and the RFID 100, the first interrogator 121 transmits a signal F1 to the RFID 100. The signal F1 includes an instruction for starting signal process in the signal processing portion 103. When the RFID 100 receives the signal F1 transmitted from the first interrogator in the antenna circuit 101, the signal F1 received by the antenna circuit 101 is input to the rectifier circuit 809 in the signal oscillating portion 102 and the demodulation circuit 813 in the signal processing portion 103.

The signal F1 is rectified in the rectifier circuit 809 to be smoothed in the power supply circuit 820. As a result, a direct-current voltage corresponding to electric field intensity (amplitude) of the signal F1 is generated. A pulse is oscillated in the oscillating circuit 806 using this direct-current voltage as a power source.

On the other hand, the demodulation circuit 813 demodulates the modulated signal F1, and the demodulated signal 920 is input to the controller 900. The controller 900 controls the pulse counter 815 based on an instruction of the signal 920, and the number of pulses of the pulse signal that is oscillated in the oscillating circuit 806 is counted by the pulse counter 815 until the number of the pulses reaches a certain value. In the controller 900, the certain value that is counted by the pulse counter 815 can be changed. In this case, this certain value may be appropriately changed in accordance with a frequency of a transmit signal from the interrogator. When the logic circuit 812 is provided with the CPU, the certain value that is counted by the pulse counter 815 may be changed in the CPU or by the controller 900.

The controller 900 generates a signal 921 for showing completion of the count when the count value reaches the certain value, and outputs the signal to the modulation circuit 814. The signal 921 is modulated in the modulation circuit 814 and transmitted from the antenna circuit 101 as a response signal S1. When the first interrogator 121 receives the response signal S1, the first interrogator 121 detects a response time period T1 from transmission of the signal F1 to reception of the response signal S1. As the distance between the interrogator 121 and the antenna circuit 101 is closer, the electric field intensity of the signal F1 becomes stronger when the signal is received by the antenna circuit 101, and amplitude of the output signal of the antenna circuit becomes increased. Therefore, since a high direct-current voltage is generated in the power supply circuit 820, a pulse signal is oscillated with a high frequency in the oscillating circuit 806, and the count in the pulse counter 815 is completed in a short time period. In other words, the distance between the interrogator 121 and the antenna circuit reflects the count time period of the pulse counter 815. Therefore, the distance can be measured based on the time period T1 that is needed for response by the RFID 100 with respect to the signal F1 of the interrogator 121.

Similarly, in each case of a second interrogator 122, a third interrogator 123, and a fourth interrogator 124, a response time period T2, a response time period T3, and a response time period T4 are detected. As described in Embodiment Mode 1, the server 140 calculates distances between the RFID 100 and each interrogator 121 to 124 based on the data received from the interrogators 121 to 124, and can detect a position (space coordinates) of the RFID based on calculated distances and position information (space coordinates, more specifically, a relative coordinate) of the interrogators 121 to 124. A manager can find a position where the RFID 100 is located by access to the server 140.

When the above structure of the present invention is employed, information on a position where the RFID is located in the space can be obtained as well as individual information such as ID included in the RFID. Further, the position information of the RFID is regularly detected, whereby information on following a track (also referred to as a flow line) of movement of equipment provided with the RFID can be obtained.

Embodiment Mode 5

In this embodiment mode, a specific structure of the RFID 100 that is applied to the position detection system in Embodiment Mode 2 will be explained.

Figure 12:
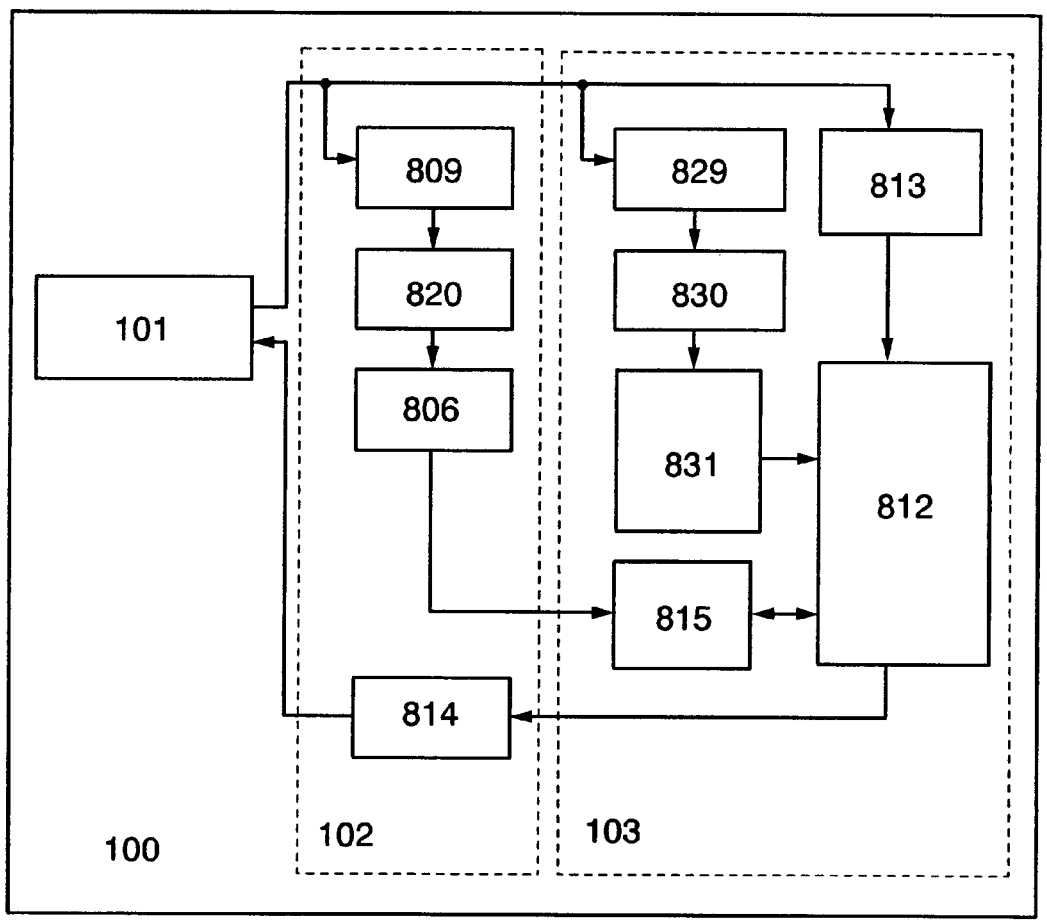
FIG. 12 is a block diagram showing a structure of a semiconductor device performing wireless communication of the present invention.

FIG. 12 is a block diagram of an RFID 100 of this embodiment mode. This embodiment mode is a modification example of the RFID 100 of Embodiment Mode 4. In this embodiment mode, a signal processing portion 103 has a rectifier circuit 829, a power supply circuit 830 provided with a regulator, and a reference clock generation circuit 831, which is a different point from the RFID 100 of Embodiment Mode 4. A structure and operation of the signal oscillating portion 102 is similar to that of Embodiment Mode 4.

In the signal processing portion 103, the rectifier circuit 829 half-waved rectifies an output signal from an antenna circuit 101. A direct-current signal by rectification is smoothed in the power supply circuit 830 to generate a direct-current voltage. Since the power supply circuit 830 is provided with a regulator, power supply with a certain voltage value can be supplied, which does not depend on electric field intensity of the received signal in the antenna circuit 101. The reference clock generation circuit 831 generates a reference clock that is to be a time standard, using the direct-current voltage as power source. In this embodiment mode, it is a feature in that the time period is measured using the reference clock in the logic circuit 812.

Figure 13:
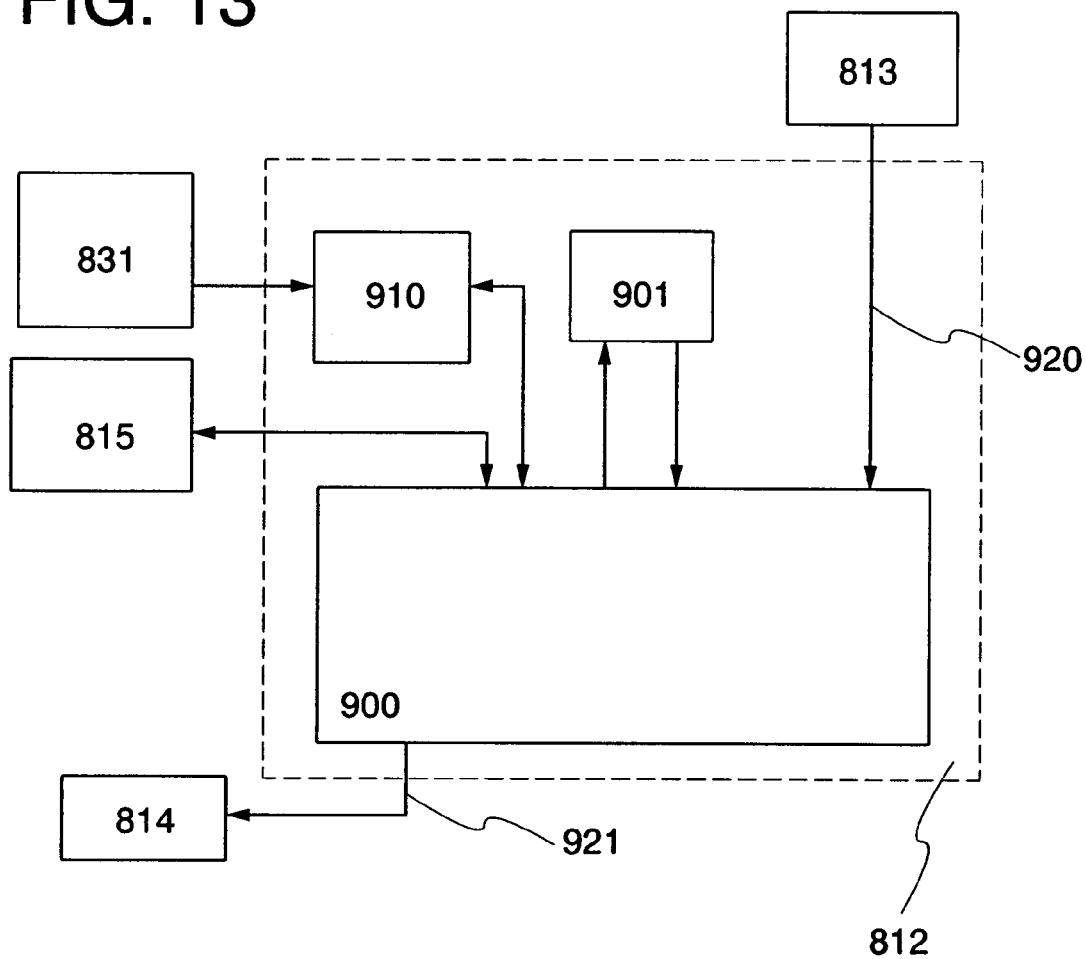
FIG. 13 is a block circuit diagram of the logic circuit 812 of FIG. 10.

FIG. 13 shows a block diagram of the logic circuit 812 of this embodiment mode. The logic circuit 812 of this embodiment mode has not only a controller 900 but also a pulse counter 910 for counting pulses of a reference clock signal generated in the reference clock generation circuit 831 and a CPU for controlling the controller 900. The pulse counter 910 is controlled by a signal of the controller 900. In the CPU 901, a distance is calculated based on the count value of the pulse counter 815 and the pulse counter 910. Since the CPU 901 is provided, the program can be executed. Therefore, the RFID 100 can be applied to various use applications in addition to the position detection.

Hereinafter, operation of a position detection system to which a semiconductor device of this embodiment mode is applied will be explained. A structure of the position detection system is similar to that of Embodiment Mode 1 (see FIG. 2), and operation thereof is similar to that of Embodiment Mode 2 (see FIG. 6).

First, in order to search a distance between a first interrogator 121 and the RFID 100, the first interrogator 121 transmits a signal F1 to the RFID 100. The signal F1 includes an instruction for starting signal process in the signal processing portion 103. When the RFID 100 receives the signal F1 transmitted from the first interrogator by an antenna circuit 101, the signal F1 received by the antenna circuit 101 is input to the signal oscillating portion 102 and the signal processing portion 103.

Operation of the signal oscillating portion 102 is similar to that of Embodiment Mode 5. In the oscillating circuit 806, a pulse signal is generated, which is oscillated with a frequency corresponding to electric field intensity of the signal F1.

In the signal processing portion 103, a direct-current voltage of a constant voltage is generated from the signal F1 received by the antenna circuit 101, by the rectifier circuit 829 and the power supply circuit 830. A reference clock is generated in the reference clock generation circuit 831 by the direct-current voltage.

Furthermore, an output of the antenna circuit 101 is input to the demodulation circuit 813, and the demodulation circuit 813 demodulates a modulated signal to output the signal to the controller 900. When a signal 920 from the interrogator is received through the demodulation circuit 813, the pulse of the oscillating circuit 806 is counted by the pulse counter 815 until the pulse reaches a certain value. Also, the controller 900 controls the pulse counter 910 to start the count of the reference clock. The count value of the pulse counter 815 corresponds to the number of oscillations of the pulse that is oscillated in the oscillating circuit 806, and the count value of the pulse counter 910 corresponds to an oscillation time period thereof. It is to be noted that the value (a certain value) of the pulse counted in the pulse counter 815 can be changed as appropriate in the controller 900 and the CPU 901. In this case, the certain value of the pulse counted by the pulse counter 815 may be changed in accordance with a frequency of the transmit signal of the interrogator.

Then, when the count value of the pulse counter 815 becomes a certain value, the controller 900 stops the count of the reference clock in the pulse counter 910 and search the count value of the pulse counter 910. The count value of the pulse counter 815 and the count value of the pulse counter 910 are output to the CPU 910 through the controller 900. The CPU 901 calculates a distance based on the two count values. The data of the distance calculated in the CPU 901 is output to the modulation circuit 814 as a signal 921 from the controller 900. The modulation circuit 814 modulates a signal to output the signal to the antenna circuit 101. The antenna circuit 101 transmits the modulated signal 921 as a response signal S1 to the first interrogator 121.

Similar operation is sequentially performed in each case of a second interrogator 122, a third interrogator 123, and a fourth interrogator 124, and a signal S2, a signal S3, and a signal S4, which show distances, are received by the second interrogator 122, the third interrogator 123, and the fourth interrogator 124, respectively. The interrogators 121 to 124, each of which is located in the space 130, transmit the data of the distances to the server 140. The server 140 specifies a position (space coordinates) of the RFID 100 based on the data of the distances received from the interrogators 121 to 124 and position information (space coordinates) of the interrogators 121 to 124. A manager can find where the RFID 100 is located by access to the server 140.

Embodiment Mode 6

In this embodiment mode, a more specific structure of the RFID 200 that is applied to the position detection system of Embodiment Mode 3 will be explained. It is to be noted that the similar structure to that of Embodiment Mode 3 is just explained briefly, and explanation of Embodiment Modes 3 to 5 is applied for the detail of the structure in this embodiment mode.

Figure 14:
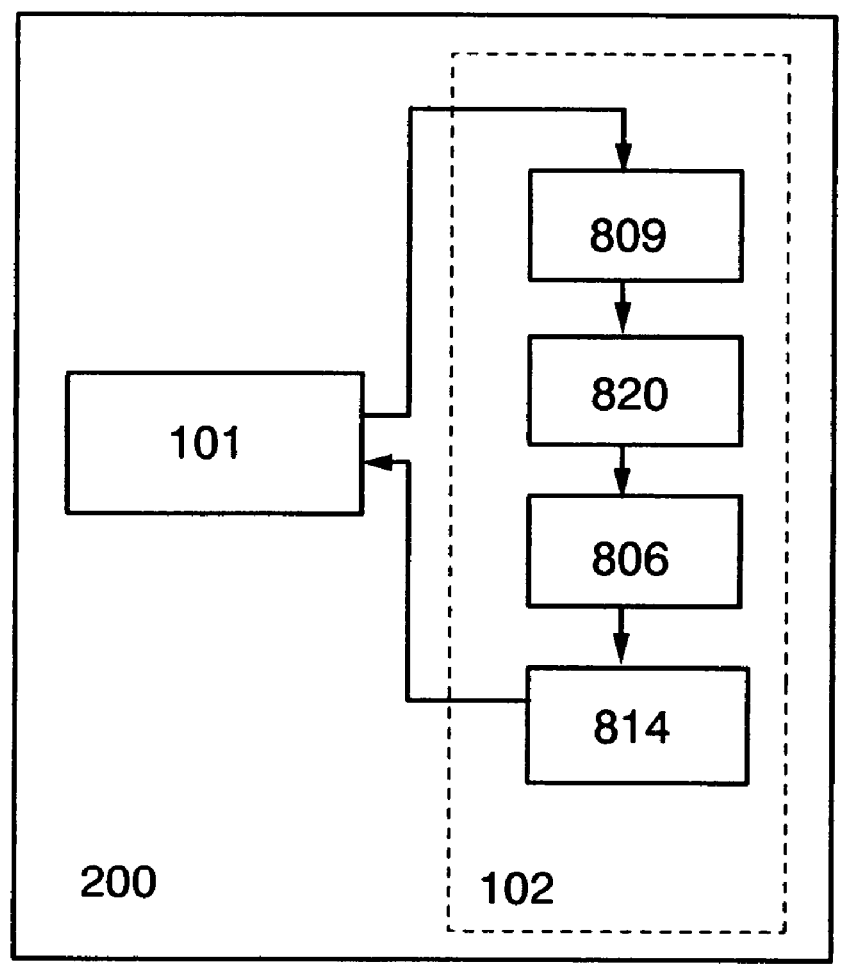
FIG. 14 is a block diagram showing a structure of a semiconductor device performing wireless communication of the present invention.

FIG. 14 is a block diagram of an RFID 200 of this embodiment mode. As shown in FIG. 14, the RFID 200 mainly includes an antenna circuit 101 and a signal oscillating portion 102 similarly to FIG. 2. The portions with the same reference numeral in FIG. 14 and FIG. 10 denote the same components; therefore, explanation of Embodiment Mode 4 is applied for the explanation of the components in this embodiment mode.

The signal oscillating portion 102 has a rectifier circuit 809 to which a received signal from the antenna circuit 101 is input, a power supply circuit 820 to which an output signal from the rectifier circuit is input, an oscillating circuit 806 that is connected to an output of the power supply circuit 820, and a modulation circuit 814 that modulates an input signal from the oscillating circuit 806 and outputs the modulated signal to the antenna circuit 101. In this embodiment mode, an output of the oscillating circuit 806 is connected to the modulation circuit 814, which is a different point from that of Embodiment Mode 4. In such a structure, a pulse signal that is oscillated in the oscillating circuit 806 can be modulated in the modulation circuit 814 to be transmitted from the antenna circuit 101.

Operation for oscillating a pulse signal in the signal oscillating portion 102 is similar to that of Embodiment Mode 4. The oscillating circuit 806 includes a ring oscillator in which a plurality of inverters are connected in a circular manner. In the rectifier circuit 809, an output signal from the antenna circuit 101 is half-wave rectified. A direct-current signal by rectification is smoothed in the power supply circuit 820, and a direct-current voltage is generated, which corresponds to electric field intensity (amplitude) of an output signal from the antenna circuit 101. With the use of the direct-current voltage generated in the power supply circuit 820 as power source, in the oscillating circuit 806, a pulse signal is oscillated with a frequency depending on a voltage value of the direct-current voltage. As described above, in the signal oscillating portion 102 of this embodiment mode, a pulse signal can be generated, which is oscillated with a frequency corresponding to electric field intensity (amplitude) of the output signal from the antenna circuit 101.

Embodiment 1

In this embodiment, a ring oscillator (a ring oscillating circuit) was formed using a thin film transistor, and then it was examined that a frequency of an oscillated signal was changed depending on an input voltage by the ring oscillator.

Figure 15:
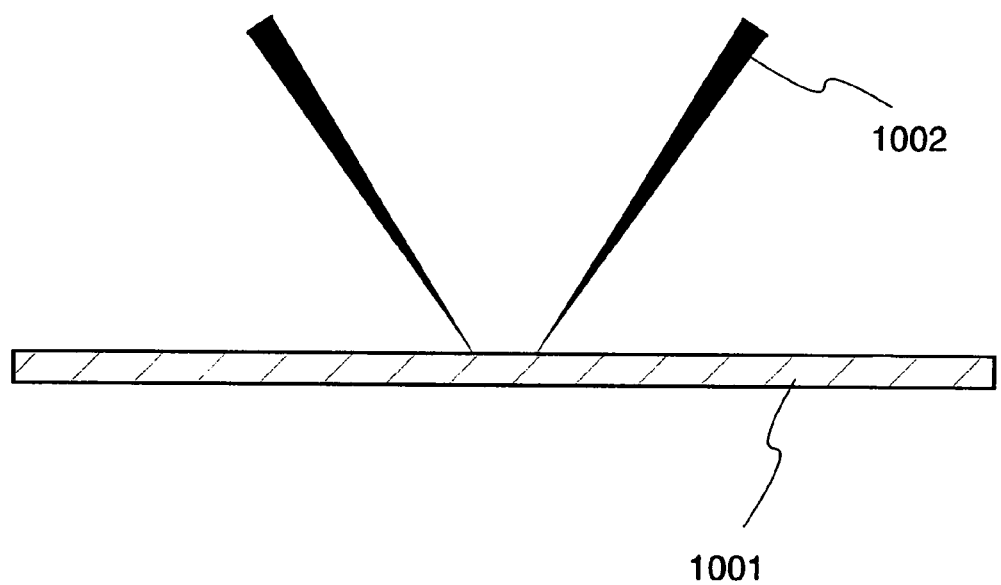
FIG. 15 is a view explaining a method for measuring the number of oscillations of a ring oscillator.

As shown in FIG. 15, a probe 1002 brought into contact with an evaluation element substrate 1001 provided with a ring oscillating circuit, and a signal is output to an oscilloscope connected to the probe 1002. A frequency was measured with the oscilloscope while changing a power supply voltage of the ring oscillator. It is to be noted that the evaluation element substrate 1001 is provided with a 19-stage ring oscillator. A channel width of an n-type thin film transistor and a channel width of a p-type thin film transistor were set to be 20 μm and 10 μm, respectively. A channel length of both thin film transistors was set to be 4.5 μm, and a film thickness of a gate insulating film thereof was set to be 110 nm. The n-type thin film transistor had an LDD structure, and the p-type thin film transistor had a single drain structure.

Figure 16:
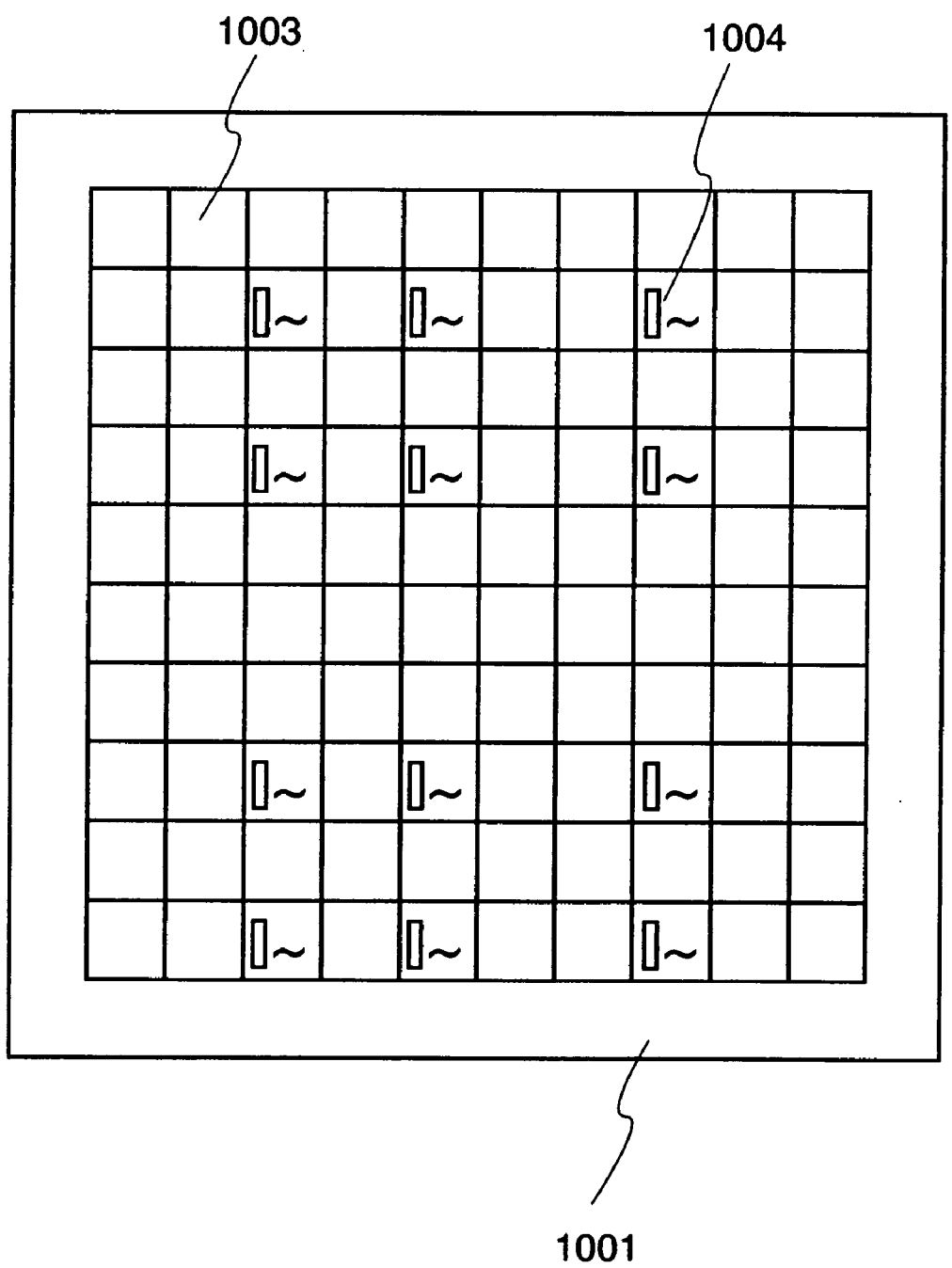
FIG. 16 is a view explaining a measuring point of an evaluation element substrate.

As shown in FIG. 16, the evaluation element substrate 1001 has a size of 5-inch (12.7 centimeters) long×5-inch (12.7 centimeters) wide. A ring oscillator 1003 was manufactured in each of 10×10 sections, and the number of oscillations of the ring oscillators 1003 was measured in twelve measurement points 1004 that are shown by x (a cross mark) of FIG. 16.

Moreover, relation of an input voltage and a frequency was simulated by a Smart SPICE model, of the above 19-stage ring oscillator which is formed using the thin film transistor.

The SPICE model (Simulation Program with Integrated Circuit Emphasis) is a model that reproduces response of an input and output of an element on SPICE-type circuit simulator that is normally used for circuit simulation. As a model for showing electric characteristics of a thin film transistor (hereinafter, referred to as a TFT), there are a various models which are approximated according to a physical phenomenon of which effect is considered. As such a model, there is a classical model called gradual channel approximation or depletion layer approximation, or a high-level and complicated model such as an RPI model. In the Smart Spice model, a LEVEL number is given for each model. A model having a larger LEVEL number tends to have higher physical precision and a larger number of parameters. However, parameter extraction based on a non-linear least square method is needed, and the calculation amount is definitely enormous. In this embodiment, LEVEL 2 was adopted, and the simulation was performed. In LEVEL 2, the depletion layer approximation is improved, and the non-linear portions are not included so much; therefore, calculation can be conducted at high speed.

Figure 17:
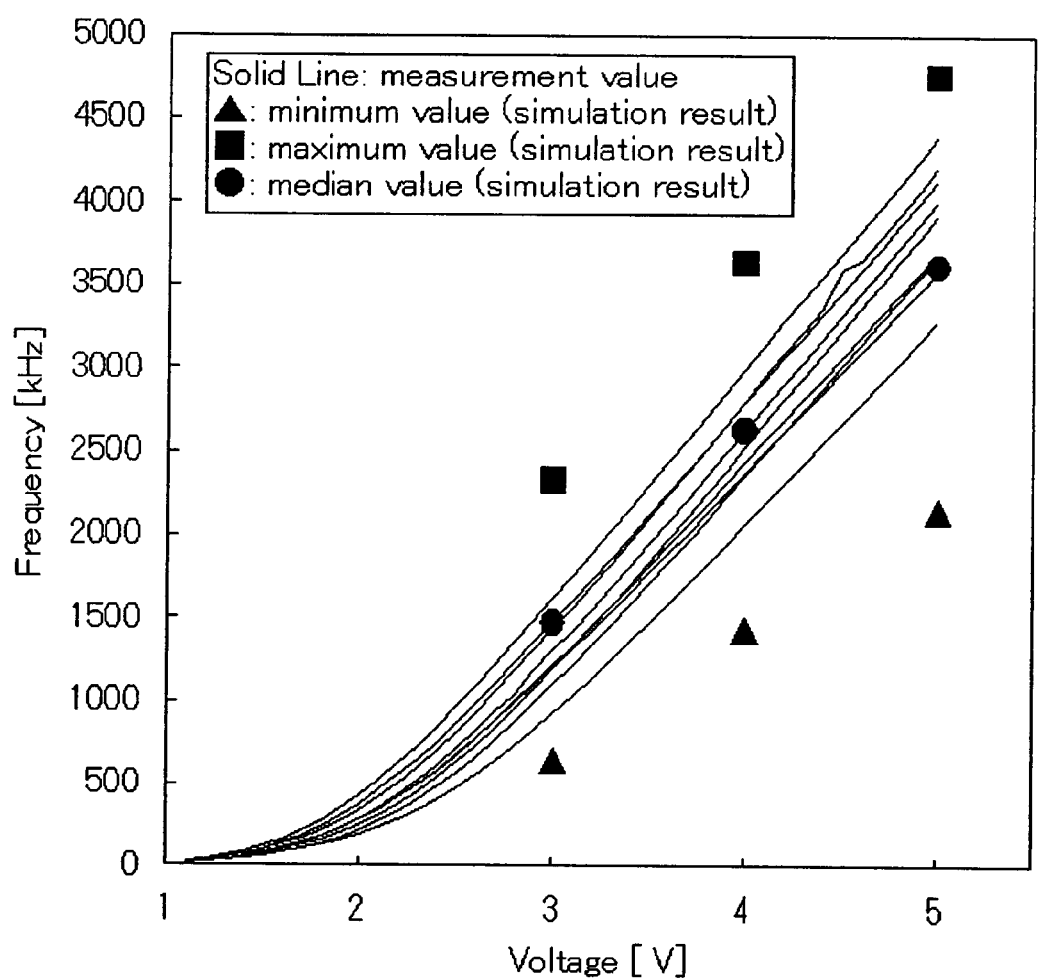
FIG. 17 is a graph of a voltage-frequency characteristic showing a measurement result and a simulation result of an oscillation frequency of a ring oscillator.

FIG. 17 shows a measurement result of the number of oscillations of a ring oscillator by an oscilloscope and a simulation result by a Smart SPICE model. In FIG. 17, a horizontal axis indicates a power supply voltage of a ring oscillator and a vertical axis indicates the number of oscillations measured by the oscilloscope. A measurement result by the oscilloscope shows a solid line. The simulation result by the Smart SPICE model is plotted by triangular marks (a minimum value), square marks (a maximum value), circular marks (a median value).

As shown in FIG. 17, it is found that the number of oscillations of a ring oscillator is changed approximately in proportion to the power supply voltage V. From the measurement result of this embodiment, it was found that a ring oscillator (a ring oscillating circuit) can be applied to an oscillating circuit in a signal oscillating portion. Further, it was found that a ring oscillator formed using a thin film transistor can be applied. Therefore, if the entire RFIDs 100 and 200 of the present invention are manufactured using a thin film transistor by this embodiment, it was verified that a semiconductor device for wireless communication can be realized, which is capable of detecting a distance and a position.

Furthermore, measurement results at each measurement points 1004 of FIG. 16 are fitted within a range of the simulation result. It was found that operation simulation of a ring oscillator using a thin film transistor, with the use of the Smart SPICE model, is effective for means for estimating the measurement result.

Embodiment 2

In this embodiment, a manufacturing method of an RFID 100 and an RFID 200 will be explained. Each circuit included in the RFID 100 and 200 relating to the present invention can be manufactured using a thin film transistor. In this embodiment, a method for manufacturing a flexible RFID 100 and RFID 200 is shown, in which a circuit included in the RFID 100 or the RFID 200 is formed using a thin film transistor, and the circuit is transferred from a substrate used for manufacturing the thin film transistor to a flexible substrate.

FIG. 18A shows an example of a top-view structure of the RFID 100 or 200. FIG. 18B shows an example of a cross-sectional structure.

As shown in FIG. 18A, in the RFID 100 or 200, an antenna 210 provided in an antenna circuit 101 and an integrated circuit portion 240 are provided. It is to be noted that the integrated circuit portion 240 corresponds to a circuit other than the antenna 210.

The RFIDs 100 and 200 of the present invention are a flexible device that can be bent and flexed. As shown in FIG. 18B, in the RFID 100 or 200, a base insulating layer 249 and an element formation layer 250 formed over the base insulating layer 249 are sealed with a flexible substrate 251 and a flexible substrate 252. The element formation layer 250 corresponds to the antenna 210 and the integrated circuit portion 240. One of surfaces (corresponding to a surface on the upper side of a substrate in manufacture) of the element formation layer 250 is provided with a protect insulating layer 253 for protecting the antenna 210.

A resin material is preferably used for the protect insulating layer 253. This is because the resin material can be formed at a low temperature; in addition, the protect insulating layer 253 is formed for reducing concavity and convexity of the antenna 210, and the resin material can be formed through drying and baking after application of a composition by a coating method. As the protect insulating layer 253, an epoxy resin layer is used. The flexible substrate 251 is bonded to the base insulating layer 249 with an adhesive 255. The flexible substrate 252 is bonded to the protect insulating layer 253 with an adhesive 256.

As described below, the element formation layer 250 is provided with a diode, a TFT, a capacitor, a resistance element, a memory element, or the like, which compose the integrated circuit portion 240, and an antenna 210. Such elements are formed over the same substrate as described below.

FIG. 23B shows a schematic cross-sectional structure of the element formation layer 250. As part of a cross-section of the antenna circuit 101, the signal oscillating portion 102, and the signal processing portion 103, a p-channel TFT (also referred to as a "Pch-TFT") 104 and an n-channel TFT (also referred to as an "Nch-TFT") 105, which are included in an inverter or the like, a capacitor 106, and a high withstand voltage-type Nch-TFT 107 provided in a power supply circuit are shown.

A substrate 260 is used when manufacturing the element formation layer 250. In this embodiment, a glass substrate is used. Over the substrate 260, a peeling layer 261 is formed, which is used for removing the substrate 260 from the element formation layer 250. After the peeling layer 261 is formed over the substrate 260, the base insulating layer 249 is formed, and then the element formation layer 250 including a TFT or the like is formed over the base insulating layer 249. Hereinafter, a forming method of the element formation layer 250 will be explained with the use of cross-sectional views shown in FIGS. 19A to 23B.

Figure 19A:
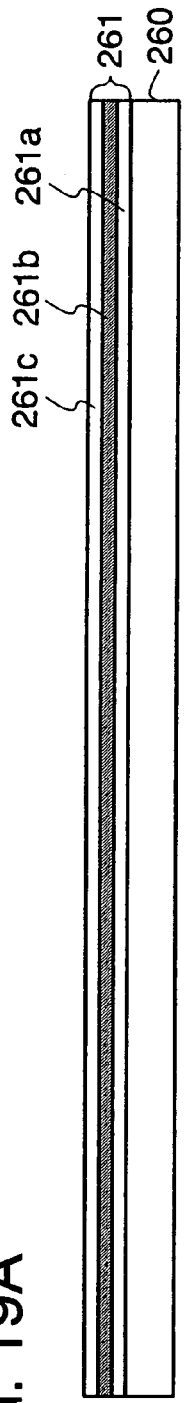
FIGS. 19A to 19D are cross-sectional views each explaining a manufacturing step of an element formation layer.

A glass substrate is used for the substrate 260. As shown in FIG. 19A, a peeling layer 261 is formed over the substrate 260, which is made of three layers of a first layer 261a, a second layer 261b, and a third layer 261c. As the first layer 261a, a silicon oxynitride ($SiO_xN_y$, x>y) film is formed to have a thickness of 100 nm using $SiH_4$ and $N_2O$ for a material gas with the use of a parallel plate-type plasma CVD device. As the second layer 261b, a tungsten film is formed to have a thickness of 30 nm with the use of a sputtering device. As the third layer 261c, a silicon oxide film is formed to have a thickness of 200 nm with the use of a sputtering device.

When the third layer 261c (silicon oxide) is formed, a surface of the second layer 261b (tungsten) is oxidized, and tungsten oxide is formed at an interface thereof. Forming tungsten oxide makes it easy to separate the substrate 260 in transferring the element formation layer 250 to another substrate. The first layer 261a holds adhesiveness of the second layer 261b while manufacturing the element formation layer 250.

For the second layer 261b, in addition to tungsten (W), a metal film of molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir), or a metal compound thereof is preferable. The second layer 261b can have a thickness of greater than or equal to 20 nm and less than or equal to 40 nm.

Figure 19B:
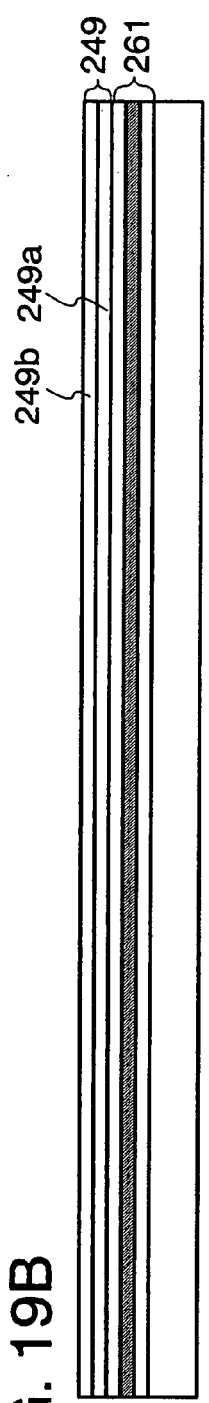

As shown in FIG. 19B, a base insulating layer 249 having a two-layer structure is formed over the peeling layer 261. As a first layer 249a, a silicon oxynitride ($SiO_xN_y$, x<y) film is formed to have a thickness of 50 nm using $SiH_4$, $N_2O$, $NH_3$, and $H_2$ for a material gas with the use of a plasma CVD device. The composition ratio of nitrogen in the first layer 249a is made to be 40% or more, and a barrier property is enhanced. As the second layer 249b, a silicon oxynitride ($SiO_xN_y$, x>y) film is formed to have a thickness of 100 nm using $SiH_4$ and $N_2O$ for a material gas with the use of a plasma CVD device. The composition ratio of nitrogen in the second layer 249b is 0.5% or less.

Figure 19C:
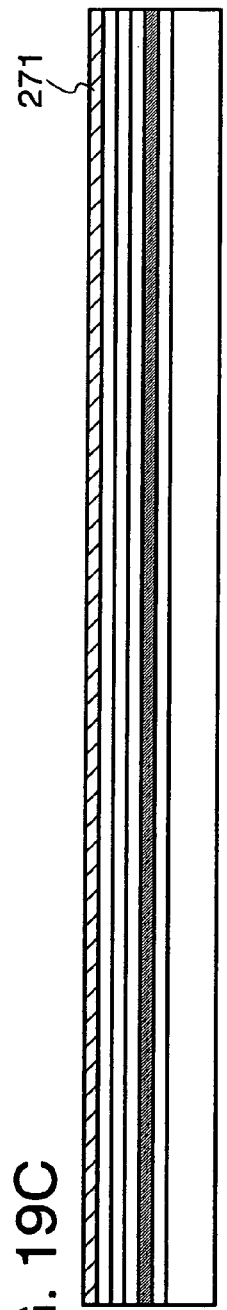

As shown in FIG. 19C, a crystalline silicon film 271 is formed over the base insulating layer 249. The crystalline silicon film 271 is formed by the following method. An amorphous silicon film having a thickness of 66 nm is formed using $SiH_4$ and $H_2$ for a material gas with the use of a plasma CVD device. The amorphous silicon film is irradiated with a laser to be crystallized, whereby the crystalline silicon film 271 is formed. An example of a laser irradiation method is shown. Irradiation of the second harmonic (a wavelength of 532 nm) of a $YVO_4$ laser of LD (laser diode) excitation is performed. A laser is not necessary to be limited to the second harmonic; however, the second harmonic is superior to third or higher harmonic in energy efficiency. At an irradiation surface, a shape of a beam is made to have a linear shape of which length is about 500 μm and of which width is about 20 μm by an optical system. Also, the beam is made to have intensity of 10 to 20 W. Further, the beam is moved at speed of 10 to 50 cm/sec relatively the substrate.

After the crystalline silicon film 271 is formed, a p-type impurity is added to the crystalline silicon film 271. Here, diborane ($B_2H_6$) that is diluted with hydrogen is used for a doping gas in an ion doping device, and boron is added to the entire crystalline silicon film 271. Since the crystalline silicon in which the amorphous silicon is crystallized has an unpaired bond, ideal intrinsic silicon is not obtained, but weak n-type conductivity is observed. Therefore, by addition of a minute amount of p-type impurity, there is an effect that the crystalline silicon film 271 is to be intrinsic silicon. This step may be performed as needed.

Figure 19D:
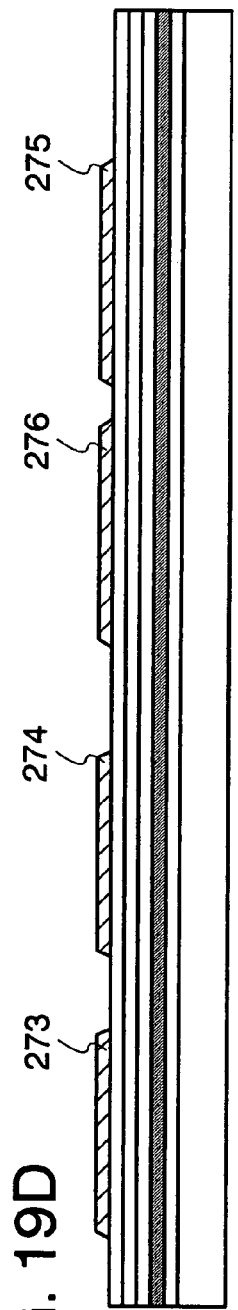

As shown in FIG. 19D, the crystalline silicon film 271 is divided for each element to form semiconductor layers 273 to 276. In each of the semiconductor layers 273 to 275, a channel formation region, a source region, and a drain region of a TFT are formed. The semiconductor layer 276 is included in an electrode of an MIS-type capacitor. An example of a method for processing the crystalline silicon film 271 is shown. A resist is formed over the crystalline silicon film 271 by a photolithography step. Then, using the resist as a mask, the crystalline silicon film 271 is etched using $SF_6$ and $O_2$ for an etchant with the use of a dry etching device, whereby the semiconductor layers 273 to 276 having a predetermined shape can be formed.

Figure 20A:
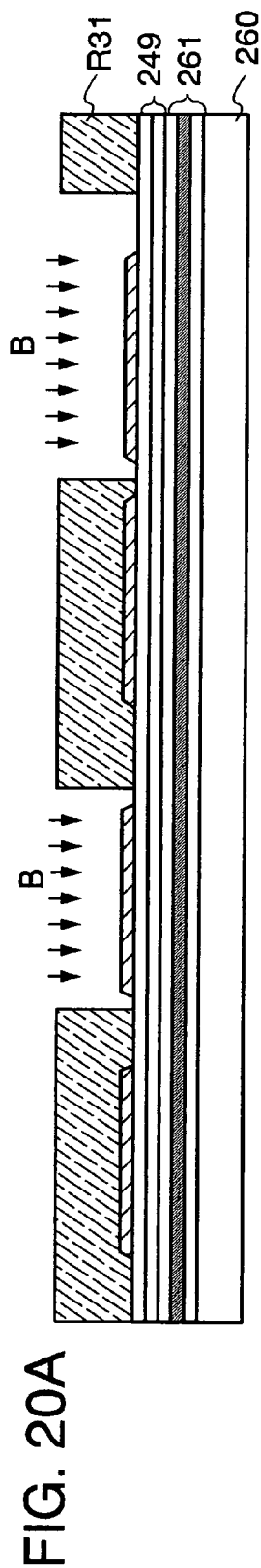
FIGS. 20A to 20D are cross-sectional views each explaining a manufacturing step of an element formation layer of a semiconductor device.

As shown in FIG. 20A, resists R31 are formed by a photolithography step, and a minute amount of p-type impurity is added to the semiconductor layers 274 and 275 of an n-channel TFT. Here, diborane ($B_2H_6$) that is diluted with hydrogen is used for a doping gas, and the semiconductor layers 274 and 275 are doped with boron with the use of an ion doping device. After doping, the resists R31 are removed.

A step of FIG. 20A is performed for the purpose that a threshold voltage of the n-channel TFT is not turned into a negative voltage. Boron may be added to the semiconductor layers 274 and 275 of the n-channel TFT at concentration of greater than or equal to $5\times10^{15}$ atoms/cm$^3$ and less than or equal to $1\times10^{17}$ atoms/cm$^3$. The step of FIG. 20A may be performed as needed.

Figure 20B:
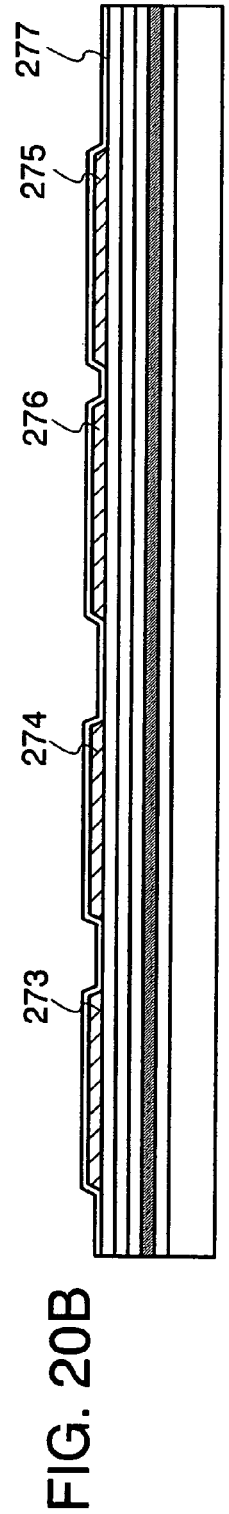

As shown in FIG. 20B, an insulating film 277 is formed over the entire substrate 260. The insulating film 277 becomes a gate insulating film of a TFT or a dielectric of a capacitor. Here, a silicon oxynitride ($SiO_xN_y$, x>y) film is formed to have a thickness of 20 to 40 nm using $SiH_4$ and $N_2O$ for a material gas with the use of a plasma CVD device.

Figure 20C:
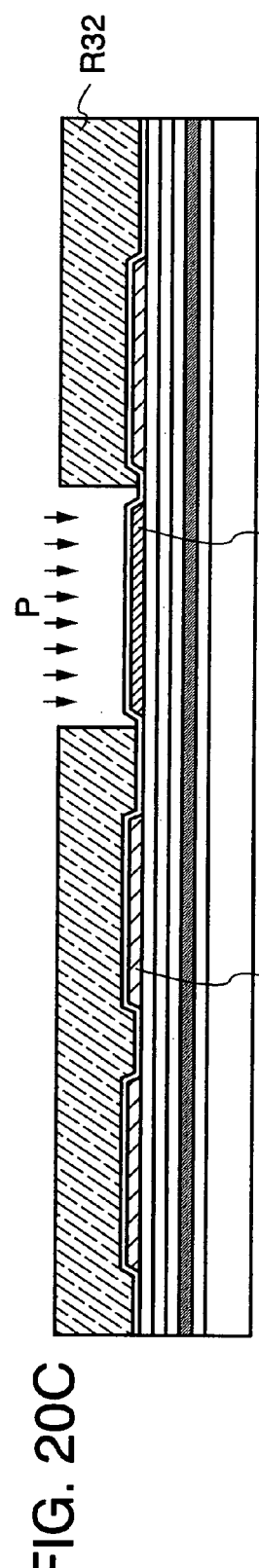

As shown in FIG. 20C, resists R32 are formed by a photolithography step, and an n-type impurity is added to the semiconductor layer 276 of a capacitor. The semiconductor layer 276 is doped with phosphorus using phosphine ($PH_3$) that is diluted with hydrogen for a doping gas, and an n-type impurity region 279 is formed. After a doping step, the resists R32 are removed.

Figure 20D:
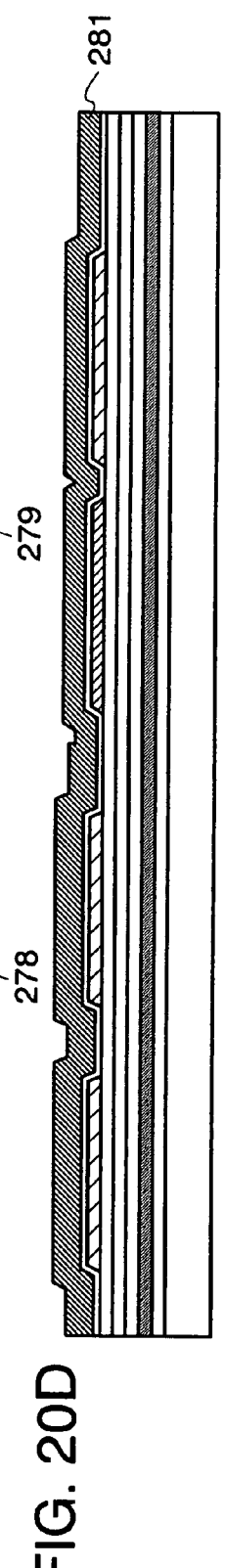

As shown in FIG. 20D, a conductive film 281 is formed over the insulating film 277. The conductive film 281 is included in a gate electrode of a TFT. Here, the conductive film 281 has a multi-layer structure of two layers. As a first layer, a tantalum nitride (TaN) film having a thickness of 30 nm is formed, and as a second layer, a tungsten (W) film having a thickness of 370 nm is formed. The tantalum nitride film and the tungsten film are each formed with the use of a sputtering device.

Figure 21A:
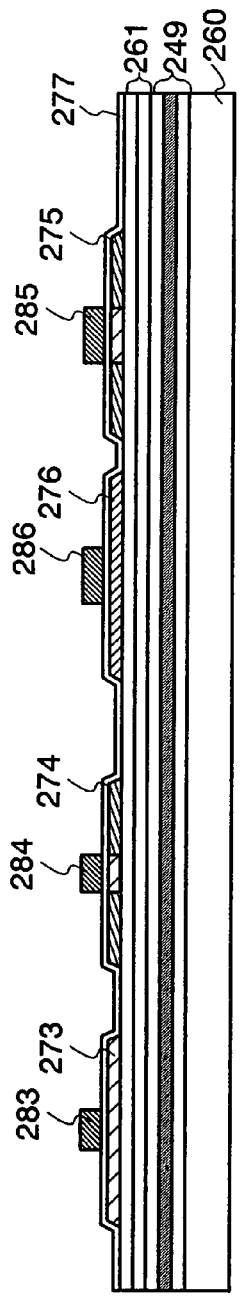
FIGS. 21A to 21D are cross-sectional views each explaining a manufacturing step of an element formation layer of a semiconductor device.

A resist is formed over the conductive film 281 by a photolithography step, and the conductive film 281 is etched using an etching device to form first conductive films 283 to 286 as shown in FIG. 21A over the semiconductor layers 273 to 276. The first conductive films 283 to 286 become a gate electrode or a gate wiring of a TFT. In the n-channel TFT that is a high withstand voltage type, the first conductive film 285 is formed so that a gate width (a channel length) can be wider than that of other TFTs. The first conductive film 286 is included in one of electrodes of the capacitor.

The conductive film 281 is etched by a dry etching method. An ICP (Inductively Coupled Plasma) etching device method is used for an etching device. As etchant, first, a mixed gas of $Cl_2$, $SF_6$, and $O_2$ is used for etching tungsten. Next, an etchant introduced to a treatment chamber is changed to only a $Cl_2$ gas, and tantalum nitride is etched.

Figure 21B:
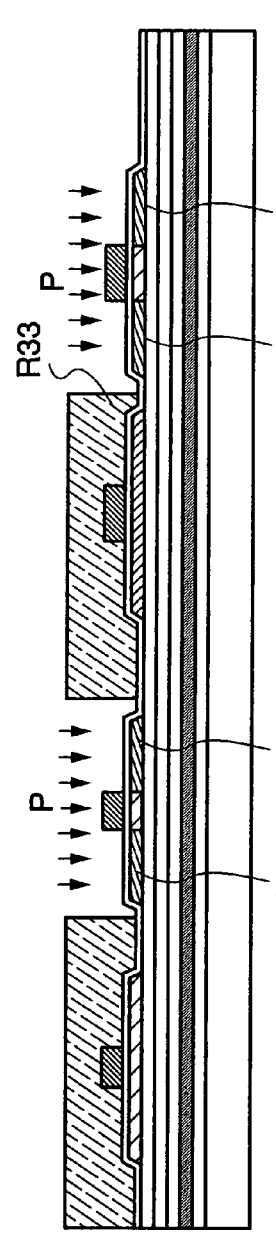

As shown in FIG. 21B, resists R33 are formed by a photolithography step. An n-type impurity is added to the semiconductor layers 274 and 275 of the n-channel TFT. N-type low concentration impurity regions 288 and 289 are formed in the semiconductor layer 274 in a self-alignment manner, using the first conductive film 284 as a mask. N-type low concentration impurity regions 290 and 291 are formed in the semiconductor layer 275 in a self-alignment manner, using the first conductive film 285 as a mask. Phosphine ($PH_3$) that is diluted with hydrogen is used for a doping gas, and phosphorus is added to the semiconductor layers 274 and 275 with the use of an ion doping device. The step of FIG. 21B is a step for forming an LDD region in the n-channel TFT. The n-type impurity is contained in the n-type low concentration impurity regions 288 and 289 within the range of greater than or equal to $1\times10^{16}$ atoms/cm$^3$ and less than or equal to $5\times10^{18}$ atoms/cm$^3$.

Figure 21C:
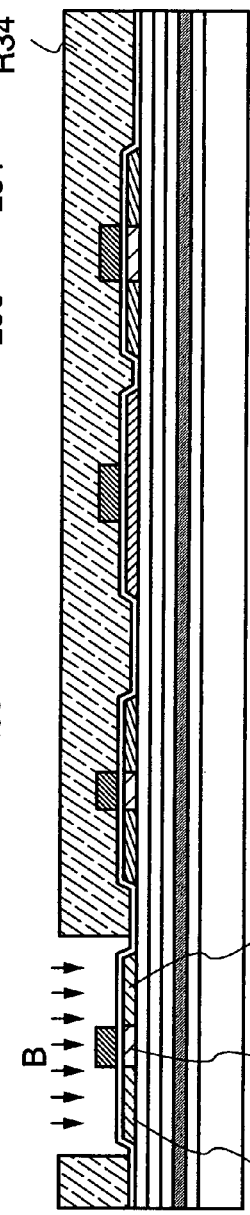

As shown in FIG. 21C, resists R34 are formed by a photolithography step, and a p-type impurity is added to the semiconductor layer 273 of a p-channel TFT. P-type high concentration impurity regions 273a and 273b are formed in the semiconductor layer 273 in a self-alignment manner, using the first conductive film 283 as a mask. Further, a region covered with the first conductive film 283 becomes a channel formation region 273c that is formed in a self-alignment manner. For addition to the p-type impurity region, diborane ($B_2H_6$) that is diluted with hydrogen is used for a doping gas. After doping, the resists R34 are removed.

Figure 21D:
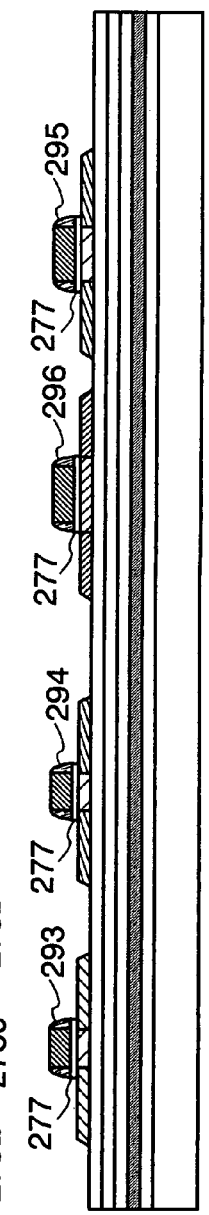

As shown in FIG. 21D, insulating layers 293 to 296 are formed around the first conductive films 283 to 286. The insulating layers 293 to 296 are referred to as a sidewall or a side wall. First, a silicon oxynitride ($SiO_xN_y$, x>y) film is formed to have a thickness of 100 nm, using $SiH_4$ and $N_2O$ for a material gas with the use of a plasma CVD device. Next, a silicon oxide film is formed to have a thickness of 200 nm using $SiH_4$ and $N_2O$ for a material gas with the use of an LPCVD device. A resist is formed by a photolithography step. With the use of this resist, an upper side of the oxide silicon film is subjected to wet etching treatment using Buffered Hydrogen Fluoride. Then, the resist is removed, and a lower side of the silicon oxynitride film is subjected to dry etching treatment, whereby the insulating layers 293 to 296 are formed. Through a series of steps, the insulating film 277 made from silicon oxynitride is also etched, and the insulating film 277 is left at only a bottom of the first conductive films 283 to 286 and the insulating layers 293 to 296.

As shown in FIG. 22A, resists R35 are formed by a photolithography step. An n-type impurity is added to the semiconductor layers 274 and 275 of the n-channel TFT and the semiconductor layer 276 of the capacitor to form n-type concentration impurity regions. In the semiconductor layer 274, an n-type impurity is further added to the n-type low concentration regions 288 and 289 using the first conductive film 284 and the insulating layer 294 as a mask to form n-type high concentration impurity regions 274a and 274b in a self-alignment manner. A region that is overlapped with the first conductive film 284 is set as a channel formation region 274c in a self-alignment manner. Regions that are overlapped with the insulating layer 294 in the n-type low concentration impurity regions 288 and 289 are set as n-type low concentration impurity regions 274e and 274d without change.

Similarly to the semiconductor layer 274, n-type high concentration impurity regions 275a and 275b, a channel formation region 275c, and n-type low concentration impurity regions 275e and 275d are formed in the semiconductor layer 275.

At this time, the n-type impurity region 279 is formed in the entire semiconductor layer 276 (see FIG. 20C). An n-type impurity is further added to the n-type impurity region 279 using the first conductive film 286 and the insulating layer 296 as a mask to form n-type high concentration impurity regions 276a and 276b in a self-alignment manner. A region in the semiconductor layer 276, which is overlapped with the first conductive film 286 and the insulating layer 296 are set as an n-type impurity region 276c.

In an addition step of the n-type impurity, phosphine ($PH_3$) that is diluted with hydrogen is used for a doping gas with the use of an ion doping device as described above. The n-type high concentration impurity regions 274a, 274b, 275a, and 275b of the n-channel TFT are doped with phosphorus at concentration of greater than or equal to $1\times10^{20}$ atoms/cm$^3$ and less than or equal to $2\times10^{21}$ atoms/cm$^3$.

The resists R35 are removed, and then a cap insulating film 298 is formed as shown in FIG. 22B). As the cap insulating film 298, a silicon oxynitride ($SiO_xN_y$, x>y) film is formed to have a thickness of 50 nm with the use of a plasma CVD device. As for a material gas of the silicon oxynitride film, $SiH_4$ and $N_2O$ are used. After the cap insulating film 298 is formed, heating treatment is performed at 550° C. in an nitrogen atmosphere, and the n-type impurity and the p-type impurity added to the semiconductor layers 273 to 276 are activated.

As shown in FIG. 22C, a first interlayer insulating film 300 is formed. The first interlayer insulating film 300 has a two-layer structure. As a first insulating film, a silicon oxynitride ($SiO_xN_y$, x<y) film is formed to have a thickness of 100 nm using $SiH_4$ and $N_2O$ for a material gas with the use of a plasma CVD device. As a second insulating film, a silicon oxynitride ($SiO_xN_y$, x>y) film is formed to have a thickness of 600 nm using $SiH_4$, $N_2O$, $NH_3$, and $H_2$ for a material gas with the use of a plasma CVD device.

The first interlayer insulating film 300 and the cap insulating film 298 are removed through a photolithography step and a dry etching step to form contact holes. A conductive film is formed over the first interlayer insulating film 300. Here, the conductive film has a four-layer structure. From the bottom, a Ti film, a TiN film, a pure aluminum film, and a TiN film are sequentially stacked having a thickness of 60 nm, 40 nm, 500 nm, and 100 nm, respectively. Each film is formed with the use of a sputtering device. The conductive film is processed into a predetermined shape through a photolithography step and a dry etching step, whereby second conductive films 303 to 314 are formed.

In order to explain that the second conductive films and the first conductive films are connected to each other, the drawings show that the second conductive films and the first conductive films are connected to each other over the semiconductor layer. However, contact portions of the second conductive films and the first conductive films are avoided to be formed over the semiconductor layer usually.

The n-type high concentration impurity regions 276a and 276b are connected by the second conductive film 312. Accordingly, an MIS-type capacitor having a stacked structure is formed, which includes the n-type impurity region 276c, the insulating film 277, and the first conductive film 286. The second conductive film 314 is a terminal of the antenna circuit 101, and an antenna 210 is connected thereto.

As shown in FIG. 23A, a second interlayer insulating film 316 is formed. A contact hole reaching the second conductive film 314 is formed in the second interlayer insulating film 316. An example in which the second interlayer insulating film 316 is formed using photosensitive polyimide is shown. Polyimide is applied to have a thickness of 1.5 µm using a spinner. The polyimide is exposed through a photolithography step and developed, whereby polyimide provided with a contact hole is formed. After development, the polyimide is baked.

Furthermore, a conductive film is formed over the second interlayer insulating film 316. This conductive film is processed into a predetermined shape through a photolithography step and an etching step to form a third conductive film 320. As a conductive film forming the third conductive film 320, a 100 nm thick Ti film is formed with the use of a sputtering device. The third conductive film 320 is a bump of an antenna for connecting the antenna 210 with the terminal (the second conductive film 314) of the antenna circuit 101.

As shown in FIG. 23B, a third interlayer insulating film 321 provided with an opening is formed. Here, the third interlayer insulating film 321 is formed using photosensitive polyamide by the similar method for forming the second interlayer insulating film 316. The opening is formed in a region where the antenna 210 is formed.

As shown in FIG. 23B, the antenna 210 is formed. Aluminum is evaporated using a metal mask with the use of an evaporation device to form the antenna 210 having a predetermined shape is formed in the opening.

Through the steps shown in FIGS. 19A to 23B, the element formation layer 250 is formed over the substrate 260. Next, as shown in FIG. 18B, a step for sealing the element formation layer 250 with the flexible substrate 251 and the flexible substrate 252 will be explained.

A protect insulating layer 253 for protecting the antenna 210 is formed. A photolithography step and an etching step are performed, or irradiation of laser light is performed, whereby an insulating film stacked over the element formation layer 250 are removed together with the protect insulating layer 253, and an opening that reaches the peeling layer 261 is formed. Over the substrate 260, a plurality of element formation layers 250 are formed. The opening is formed to divide the element formation layer 250 one by one.

Next, after a substrate for transfer is temporarily fixed over an upper surface of the protect insulating layer 253, the substrate 260 is peeled. Since junction at an interface between the second layer 261b and the third layer 261c of the peeling layer 261 is weak, peeling from an end portion of the opening proceeds by addition of force physically, and the substrate 260 can be peeled from the element formation layer 250. The flexible substrate 251 is bonded with an adhesive 255 to the base insulating layer 249 from which the substrate 260 is peeled. Then, the substrate for transfer is removed. The flexible substrate 252 is bonded with an adhesive 256 to the protect insulating layer 253. Heat treatment is performed while pressure is given from an outside of the flexible substrate 251 and the flexible substrate 252, whereby the element formation layer 250 is sealed with the flexible substrate 251 and the flexible substrate 252.

Although an example in which the antenna 210 is formed together with the integrated circuit portion 240 is shown in this embodiment, formation of the antenna 210 can be omitted. In this case, an antenna is provided for the flexible substrate, and attachment may be performed so that the antenna is electrically connected to the integrated circuit portion 240 of the element formation layer 250.

Further, although an example in which the substrate used in manufacture is peeled from the element formation layer 250 is shown in this embodiment, the substrate used in manufacture can be left. In that case, the substrate may be thinned by grinding or polishing so that the substrate can be bent.

When a circuit is formed using a thin film transistor, the thin and lightweight RFIDs 100 and 200 capable of being bent can be manufactured.

Embodiment 3

Figure 24:
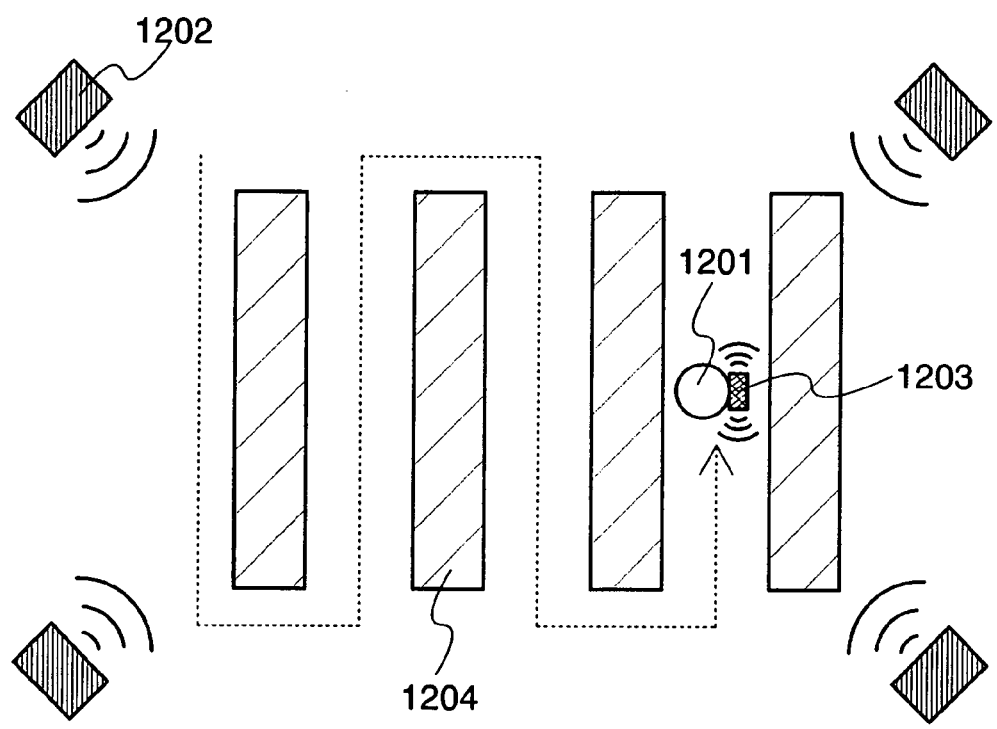
FIG. 24 is a schematic view showing a management system of a moving object using a position detection system of the present invention.

In this embodiment, as an example of utilizing a semiconductor device and a position detection system relating to the present invention, a product management system and a management system of a moving object in an indoor or the like will be explained with reference to FIG. 24.

First, a case where a customer purchases a product in a store is explained with reference to FIG. 24. The semiconductor device of the present invention as well as an ID label or an ID tag incorporating information such as product-specific information or production history are attached to products displayed in the store.

A customer 1201 having a product 1203 provided with the semiconductor device of the present invention moves in the store surrounded by interrogators 1202 for position detection, which are placed in the store. As shown in the above embodiment modes, a manager can manage a flow line of the customer 1201 moving around display cabinets 1204 by detecting a position of the semiconductor device of the present invention by the interrogators 1202 placed in the store. It is preferable to record and manage the flow line of the customer because marketing such as a location for providing a product and product management can be performed efficiently.

As shown in this embodiment, a flow line of the product in the store is observed in real time by a plurality of interrogators placed in the store, so that theft can be prevented without the customer going through a gate of an interrogator for preventing theft from the display cabinets. Further, since the flow line of the product can be observed in real time, the manager can forecast information on move of a thief in advance with use of a computer or the like, and take measures such as blocking the passage, and thus, theft of the product can be prevented from occurring. Accordingly, the manager can capture the thief without directly catching the thief, whereby the thief can be easily caught.

In this embodiment, the manager can manage position information of the product in real time without providing a gate-shaped interrogator at a doorway and without the customer noticing an interrogator, if the interrogator is placed in a part of tiles of a floor, a part of pillars, a ceiling, or the like. By the position detection system using the semiconductor device of the present invention, a flow line of the product in a small area, which is difficult for a GPS or the like to trace, can be easily traced. Further, the semiconductor device of the present invention can cover a range of several m when an antenna for the UHF band is used. Further, it is preferable that the semiconductor device of the present invention have an anti-collision function because a plurality of moving objects can also be managed.

A position detection system using the semiconductor device of the present invention is effective in preventing theft by using together with a surveillance camera or the like. The manager can perform management from a remote place more certainly and easily.

In addition, it is preferable that an accurate flow line of a moving object provided with the RFID can be observed easily even in a large space by increase in the number of the plurality of interrogators in the present invention.

Embodiment 4

In this embodiment, as an example of utilizing the semiconductor device and the position detection system relating to the present invention, a management system of a moving object in a passage or the like will be explained with reference to FIG. 25.

First, an example where a manager manages a flow line of the moving object in the passage is explained with reference to FIG. 25. The moving object is provided with the semiconductor device of the present invention as well as an ID label or an ID tag incorporating specific information.

Hereinafter, an example of a management system of a moving object in a passage or the like will be explained with reference to FIG. 25.

A moving object 1301 having a semiconductor device 1303 of the present invention moves in a space surrounded by interrogators 1302 for position detection, which are placed in a passage. As a matter of course, a mode is similar to this embodiment, in which the moving object 1301 having equipment provided with the semiconductor device 1303 of the present invention moves. As shown in the above embodiment modes, a manager can manage flow line of the semiconductor device 1303 on the passage separated by obstructions 1304 by detecting a position of the semiconductor device 1303 of the present invention using the interrogators 1302 placed in the passage. Further, speed and a tendency of the moving object can be observed. In FIG. 25, a case where the moving object 1301 reaches a destination 1306 through a path shown by slanted lines 1305 is shown, and for example, move of the moving object following another path without following the path shown in the slanted lines can be easily observed in real time. The flow line of the moving object can be managed and recorded. Therefore, it is preferable that marketing such as product management can be performed efficiently when the moving object is a customer having a product provided with the semiconductor device. In the present invention, when an RFID is provided for an object person among an unspecified number of moving objects, move of the only moving object can be managed. Thus, when the semiconductor device is attached to a small child, move of the child in a crowd can be managed successively.

Figure 25:
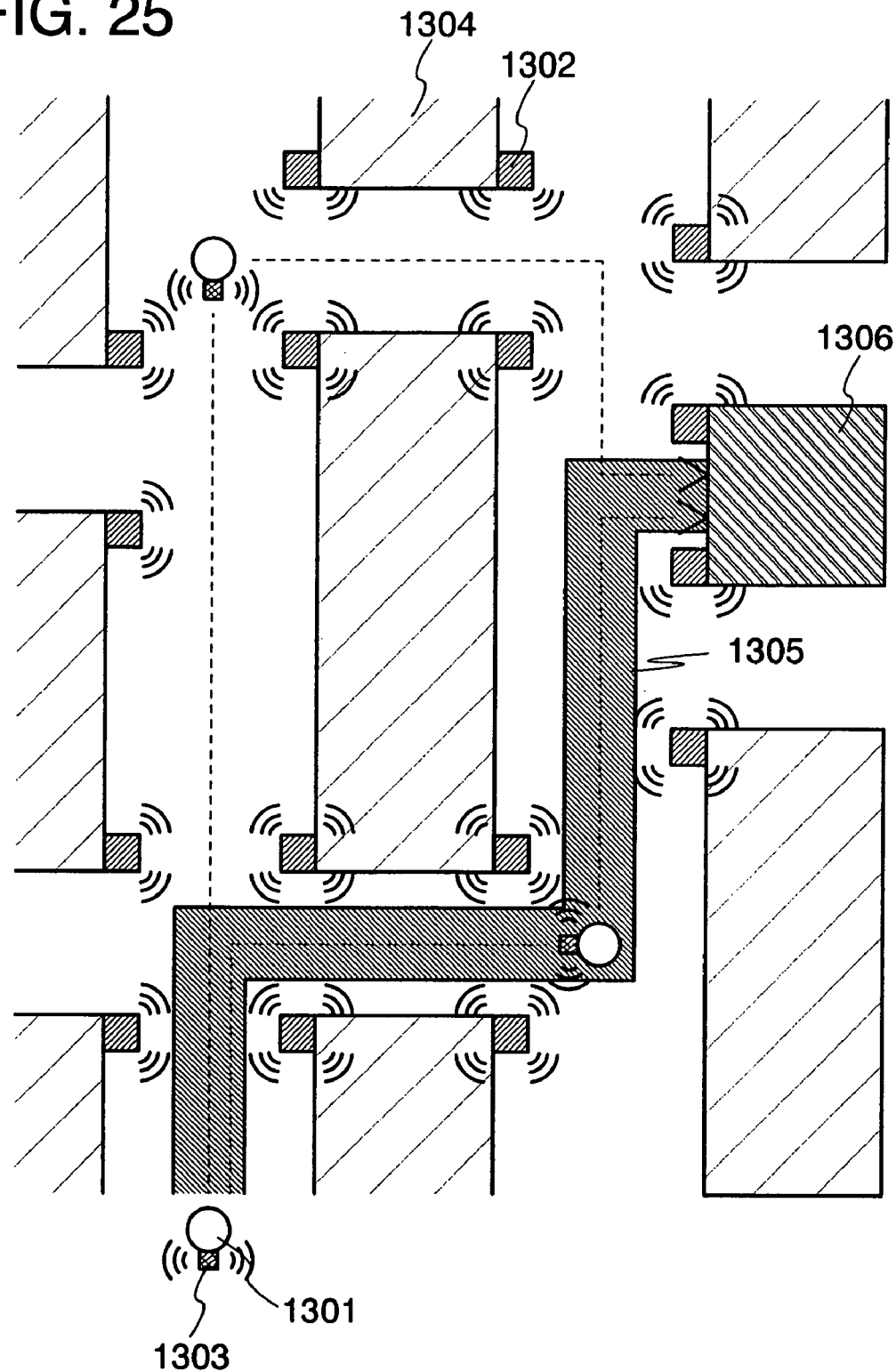
FIG. 25 is a schematic view showing a management system of a moving object using a position diction system of the present invention.

In FIG. 25, as an object of the moving object 1301 to which the RFID is attached, a criminal in prison, a person in need of care in a nursing home, and the like are considered. It is particularly effective that a flow line of a criminal in prison or a person in need of care in a nursing home can be managed, for example, when the RFID of the present invention is attached to the criminal in prison or the person in need of care in the nursing home, and the position detection system of the present invention is used for management. By the position detection system using the semiconductor device of the present invention, with respect to the criminal in prison, suspicious movement can be observed in advance. Further, in the nursing home, it is preferable to observe a wandering tendency for the person in need of care and to take appropriate measures.

As a management method for a moving object in an indoor space such as a passage, there are a method where cameras are located and a method where interrogators are provided at regular intervals to detect a position in one moving object by one interrogator for each other; however, it is difficult to follow a flow line in real time and to observe tendency of the flow line. A position of an RFID can be regularly detected by a position detection system of the present invention, in which a position of one moving object is detected by the plurality of the interrogators with the use of the semiconductor device of the present invention and a plurality of interrogators. Therefore, move of a moving object can be managed and recorded successively in real time. It is preferable that the manager can observe tendency of the flow line by recording the flow line, and storing and analyzing the records; and can redesign layout of a room in which the flow line is observed.

This application is based on Japanese Patent Application serial no. 2006-141841 filed in Japan Patent Office on May 22 in 2006, the entire contents of which are hereby incorporated by reference.

EXPLANATION OF REFERENCE

100: RFID, 101: antenna circuit, 102: signal oscillating portion, 103: signal processing portion, 104: p-channel TFT, 105: n-channel TFT, 106: capacitor, 107: high withstand voltage-type Nch-TFT, 121: interrogator, 122: interrogator, 123: interrogator, 124: interrogator, 130: space, 140: server, 200: RFID, 210: antenna, 230: memory portion, 240: integrated circuit portion, 249: base insulating layer, 249a: first layer, 249b: second layer, 250: element formation layer, 251: flexible substrate, 252: flexible substrate, 253: protect insulating layer, 255: adhesive, 256: adhesive, 260: substrate, 261: peeling layer, 261a: first layer, 261b: second layer, 261c: third layer, 271: crystalline silicon film, 273: semiconductor layer, 273a: p-type high concentration impurity region, 273b: p-type high concentration impurity region, 273c: channel formation region, 274: semiconductor layer, 274a: n-type high concentration impurity region, 274b: n-type high concentration impurity region, 274c: channel formation region, 274d: n-type low concentration impurity region, 274e: n-type low concentration impurity region, 275: semiconductor layer, 275a: n-type high concentration impurity region, 275b: n-type high concentration impurity region, 275c: channel formation region, 275d: n-type low concentration impurity region, 275e: n-type low concentration impurity region, 276: semiconductor layer, 276a: n-type high concentration impurity region, 276b: n-type high concentration impurity region, 276c: n-type impurity region, 277: insulating film, 279: n-type impurity region, 281: conductive film, 283: first conductive film, 284: first conductive film, 285: first conductive film, 286: first conductive film, 288: n-type low concentration impurity region, 290: n-type low concentration impurity region, 293: insulating layer, 294: insulating layer, 295: insulating layer, 296: insulating layer, 298: cap insulating film, 300: first interlayer insulating film, 302: conductive film, 303: second conductive film, 304: second conductive film, 305: second conductive film, 306: second conductive film, 307: second conductive film, 308: second conductive film, 309: second conductive film, 310: second conductive film, 311: second conductive film, 312: second conductive film, 313: second conductive film, 314: second conductive film, 316: second interlayer insulating film, 320: third conductive film, 321: third interlayer insulating film, 806: oscillating circuit, 809: rectifier circuit, 812: logic circuit, 813: demodulation circuit, 814: modulation circuit, 815: pulse counter, 820: power supply circuit, 829: rectifier circuit, 830: power supply circuit, 831: reference clock generation circuit, 900: controller, 901: CPU, 902: signal, 910: pulse counter, 920: signal, 921: signal, 1001: evaluation element substrate, 1002: probe, 1003: ring oscillator, 1004: measurement point, 1201: customer, 1202: interrogator, 1203: product, 1204: display cabinet, 1301: moving object, 1302: interrogator, 1303: semiconductor device, 1304: obstruction, 1305: slanted line, 1306: destination, 1400: RFID, 1401: antenna circuit, 1402: signal processing circuit, 1403: cell, 1404: power supply circuit, 1405: demodulation circuit, 1406: amplifier, 1407: logic circuit, 1408: memory control circuit, 1409: memory circuit, 1410: logic circuit, 1411: amplifier, 1412: modulation circuit, 1500: RFID, 1501: antenna circuit, 1502: signal processing circuit, 1503: rectifier circuit, 1504: power supply circuit, 1505: demodulation circuit, 1506: amplifier, 1507: logic circuit, 1508: memory control circuit, 1509: memory circuit, 1510: logic circuit, 1511: amplifier, 1512: modulation circuit

The invention claimed is:

1. A semiconductor device comprising:
   an antenna circuit configured to transmit and receive a signal;
   a signal oscillating portion comprising:
      a first rectifier circuit configured to rectify the signal received by the antenna circuit;
      a first power supply circuit configured to generate a first direct-current voltage by smoothing an output of the first rectifier circuit; and
      a ring oscillating circuit configured to generate an oscillating signal using the first direct-current voltage as a power source; and
   a signal processing portion comprising:
      a first counter configured to count the number of oscillations of the oscillating signal;
      a second rectifier circuit configured to rectify the signal received by the antenna circuit;
      a second power supply circuit comprising a regulator and configured to generate a second direct-current voltage by smoothing an output of the second rectifier circuit;
      a reference clock generation circuit configured to generate a reference clock using the second direct-current voltage as a power source; and
      a logic circuit comprising:
         a CPU; and
         a second counter configured to count the reference clock and output a counter value of the second counter to the CPU at a time when a counter value of the first counter reaches a predetermined value.

2. A semiconductor device according to claim 1, wherein the signal transmitted from the antenna circuit shows completion of the count.

3. A semiconductor device according to claim 1, wherein the signal transmitted from the antenna circuit shows a distance from a source of the signal received by the antenna circuit.

4. A semiconductor device according to claim 1, wherein the logic circuit comprises a controller.

5. A semiconductor device comprising:
   an antenna circuit configured to transmit and receive a signal;
   a signal oscillating portion comprising:
      a first rectifier circuit configured to rectify the signal received by the antenna circuit;

a first power supply circuit configured to generate a first direct-current voltage by smoothing an output of the first rectifier circuit; and
a ring oscillating circuit configured to generate an oscillating signal using the first direct-current voltage as a power source; and
a signal processing portion comprising:
a first counter configured to count the number of oscillations of the oscillating signal;
a second rectifier circuit configured to rectify the signal received by the antenna circuit;
a second power supply circuit comprising a regulator and configured to generate a second direct-current voltage by smoothing an output of the second rectifier circuit;
a reference clock generation circuit configured to generate a reference clock using the second direct-current voltage as a power source; and
a logic circuit
comprising:
a CPU; and
a second counter configured to count the reference clock and output a counter value of the second counter to the CPU at a time when a counter value of the first counter reaches a predetermined value,
wherein an amplitude of the first direct-current voltage decreases as a distance from the antenna circuit to a source of the signal received by the antenna circuit increases,
wherein an amplitude of the second direct-current voltage does not depend on a change of the distance, and
wherein a frequency of the oscillating signal decreases as the amplitude of the first direct-current voltage decreases.

6. A semiconductor device according to claim 1,
wherein the signal transmitted from the antenna circuit is the oscillating signal.

7. A position detection system comprising:
a semiconductor device comprising:
an antenna circuit configured to transmit and receive a signal;
a signal oscillating portion comprising:
a first rectifier circuit configured to rectify the signal received by the antenna circuit;
a first power supply circuit configured to generate a first direct-current voltage by smoothing an output of the first rectifier circuit; and
a ring oscillating circuit configured to generate an oscillating signal using the first direct-current voltage as a power source; and
a signal processing portion comprising:
a first counter configured to count the number of oscillations of the oscillating signal;
a second rectifier circuit configured to rectify the signal received by the antenna circuit;
a second power supply circuit comprising a regulator and configured to generate a second direct-current voltage by smoothing an output of the second rectifier circuit;
a reference clock generation circuit configured to generate a reference clock using the second direct-current voltage as a power source; and
a logic circuit comprising:
a CPU; and
a second counter configured to count the reference clock and output a counter value of the second counter to the CPU at a time when a counter value of the first counter reaches a predetermined value, and
a plurality of interrogators,
wherein each of the plurality of interrogators is configured to sequentially transmit a first signal,
wherein the antenna circuit is configured to output the first signal to the signal oscillating portion and the signal processing portion after receiving the first signal,
wherein the first counter is configured to start counting after the signal processing portion receives the first signal,
wherein the second counter is configured to start counting after the signal processing portion receives the first signal,
wherein each of the interrogators is configured to sequentially detect a distance to the semiconductor device using the signal corresponding to the counter value of the second counter, and
wherein the position of the semiconductor device is detected using the distance from each of the plurality of interrogators to the semiconductor device.

8. A position detection system comprising:
a semiconductor device comprising:
an antenna circuit configured to transmit and receive a signal;
a signal oscillating portion comprising:
a first rectifier circuit configured to rectify the signal received by the antenna circuit;
a first power supply circuit configured to generate a first direct-current voltage by smoothing an output of the first rectifier circuit; and
a ring oscillating circuit configured to generate an oscillating signal using the first direct-current voltage as a power source; and
a signal processing portion comprising:
a first counter configured to count the number of oscillations of the oscillating signal;
a second rectifier circuit configured to rectify the signal received by the antenna circuit;
a second power supply circuit comprising a regulator and configured to generate a second direct-current voltage by smoothing an output of the second rectifier circuit;
a reference clock generation circuit configured to generate a reference clock using the second direct-current voltage as a power source; and
a logic circuit comprising:
a CPU; and
a second counter configured to count the reference clock and output a counter value of the second counter to the CPU at a time when a counter value of the first counter reaches a predetermined value, and
a plurality of interrogators,
wherein an amplitude of the first direct-current voltage decreases as a distance from the antenna circuit to a source of the signal received by the antenna circuit increases,
wherein an amplitude of the second direct-current voltage does not depend on a change of the distance, and
wherein a frequency of the oscillating signal decreases as the amplitude of the first direct-current voltage decreases,
wherein each of the plurality of interrogators is configured to sequentially transmit a first signal, wherein the antenna circuit is configured to output the first signal to the signal oscillating portion and the signal processing portion after receiving the first signal, wherein the first counter is configured to start counting after the signal processing portion receives the first signal, wherein the second counter is configured to start counting after the signal processing portion receives the first signal, wherein each of the interrogators is configured to sequentially detect a distance to the semiconductor device using the signal corresponding to the counter value of the second counter, and wherein the position of the semiconductor device is detected using the distance from each of the plurality of interrogators to the semiconductor device.

9. A semiconductor device according to claim 5, wherein the signal transmitted from the antenna circuit shows completion of the count.

10. A semiconductor device according to claim 5, wherein the signal transmitted from the antenna circuit shows the distance from the source of the signal received by the antenna circuit.

11. A semiconductor device according to claim 5, wherein the signal transmitted from the antenna circuit is the oscillating signal.

12. A semiconductor device according to claim 5, wherein the logic circuit comprises a controller.

* * * * *